US012776368B2

(12) United States Patent
Kao et al.

(10) Patent No.: US 12,776,368 B2
(45) Date of Patent: Oct. 27, 2026

(54) RECONFIGURABLE IN-MEMORY PHYSICALLY UNCLONABLE FUNCTION DEVICE AND METHOD OF OPERATING THE SAME

(71) Applicant: TAIWAN SEMICONDUCTOR MANUFACTURING COMPANY, LTD., Hsinchu (TW)

(72) Inventors: Yun-Feng Kao, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 41 days.

(21) Appl. No.: 18/789,837

(22) Filed: Jul. 31, 2024

(65) Prior Publication Data

US 2024/0395322 A1 Nov. 28, 2024

Related U.S. Application Data

(62) Division of application No. 17/576,906, filed on Jan. 14, 2022, now Pat. No. 12,249,371.

(60) Provisional application No. 63/260,192, filed on Aug. 12, 2021.

(51) Int. Cl.

*G11C 11/00* (2006.01)
*G11C 11/16* (2006.01)
*G11C 11/22* (2006.01)
*G11C 13/00* (2006.01)

(52) U.S. Cl.

CPC ...... *G11C 13/0059* (2013.01); *G11C 11/1695* (2013.01); *G11C 11/2295* (2013.01)

(58) Field of Classification Search

CPC ............ G11C 13/0059; G11C 11/1695; G11C 11/2295; G11C 11/1673; G11C 13/004; G11C 13/003; G11C 11/1659; G11C 11/1675; G11C 13/0004; G11C 13/0069; G09C 1/00; H04L 2209/12; H04L 9/0866; H04L 9/3278

USPC ............................................................ 365/148

See application file for complete search history.

(56) References Cited

U.S. PATENT DOCUMENTS

| | | | | |
|---|---|---|---|---|
| 7,599,210 | B2 | 10/2009 | Okazaki | |
| 8,508,983 | B2 | 8/2013 | Wang | |
| 8,947,913 | B1 | 2/2015 | Derhacobian | |
| 9,404,966 | B2 * | 8/2016 | Dwivedi | G11C 7/22 |
| 9,762,241 | B1 | 9/2017 | Augustine | |
| 9,870,811 | B2 | 1/2018 | Wang | |
| 10,298,407 | B2 | 5/2019 | Tanamoto | |
| 10,424,380 | B1 | 9/2019 | Li | |

(Continued)

FOREIGN PATENT DOCUMENTS

| | | |
|---|---|---|
| CN | 109509495 | 3/2019 |
| TW | I504033 | 10/2015 |

(Continued)

*Primary Examiner* — Tha-O H Bui

(74) *Attorney, Agent, or Firm* — Hauptman Ham, LLP

(57) ABSTRACT

A semiconductor device includes an array of M inverters, M being an integer of at least 2 such that the array of M inverters includes at least a first inverter and a second inverter; (M−1) pairs of resistive memory devices (RMDs) coupled to the array of M inverters; and a write line coupled to an input of the first inverter. (M−1) inverters of the array of M inverters are each connected in parallel with a pair of RMDs of the (M−1) pairs of RMDs.

20 Claims, 14 Drawing Sheets

(56) References Cited

U.S. PATENT DOCUMENTS

| | | | | |
|---|---|---|---|---|
| 10,784,313 | B1 * | 9/2020 | Gong | G06N 3/0499 |
| 10,803,942 | B1 | 10/2020 | Jung | |
| 10,860,292 | B2 | 12/2020 | Ielmini | |
| 11,087,837 | B2 | 8/2021 | Huynh | |
| 2008/0247217 | A1 | 10/2008 | Ruf | |
| 2019/0132137 | A1 | 5/2019 | Zhong | |

FOREIGN PATENT DOCUMENTS

| | | |
|---|---|---|
| TW | I560714 | 12/2016 |
| TW | I627555 | 6/2018 |
| TW | I733854 | 7/2021 |

* cited by examiner

400B

RECONFIGURABLE IN-MEMORY PHYSICALLY UNCLONABLE FUNCTION DEVICE AND METHOD OF OPERATING THE SAME

CROSS REFERENCE TO RELATED APPLICATIONS

This application is a division of U.S. patent application Ser. No. 17/576,906, filed Jan. 14, 2022, now U.S. Pat. No. 12,249,371, issued Mar. 11, 2025, which claims the benefit of U.S. Provisional Application No. 63/260,192, filed on Aug. 12, 2021, the disclosures of each of which are hereby incorporated by reference in their entireties.

BACKGROUND

The semiconductor integrated circuit (IC) industry produces a variety of analog and digital devices to address issues in a number of different areas. Developments in semiconductor process technology nodes have progressively reduced component sizes and tightened spacing resulting in progressively increased transistor density. ICs have become smaller.

A physically unclonable function (PUF) is a physical device that, for a given input and conditions (e.g., challenge), outputs a physically defined digital fingerprint response that serves as a unique identifier. PUFs are often used in applications with high security requirements, such as cryptography.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
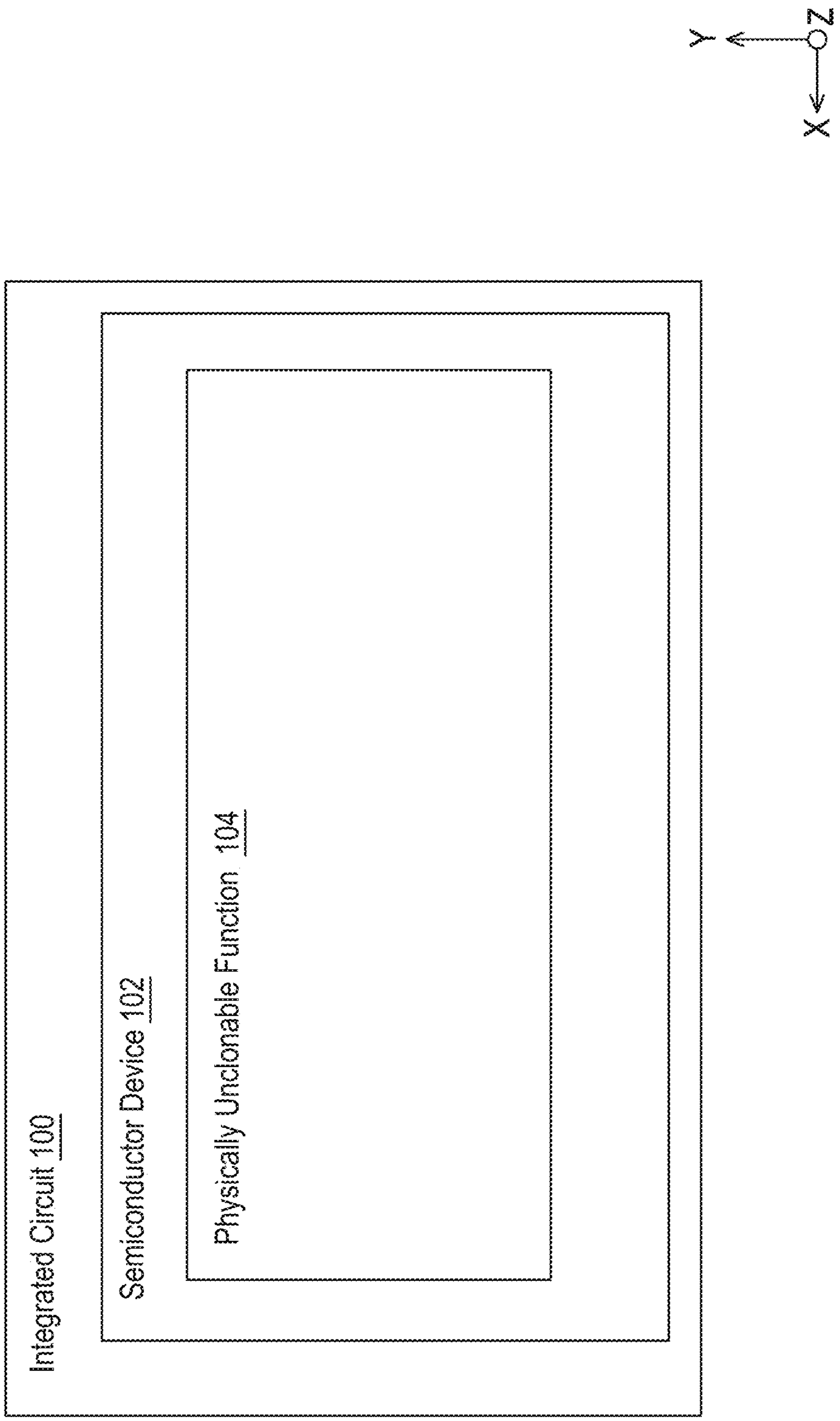
FIG. 1 is a block diagram of an integrated circuit (IC), in accordance with some embodiments.

The following disclosure discloses many different embodiments, or examples, for implementing different features of the subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may further include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some embodiments, the term “standard cell structure” refers to a standardized building block included in a library of various standard cell structures. In some embodiments, various standard cell structures are selected from a library thereof and are used as components in a layout diagram representing a circuit.

In various embodiments, a semiconductor device includes a PUF including two inverters connected in series, a first resistive memory device (RMD) coupled between an output of the first inverter and an output node, and a second RMD coupled between an output of the second inverter and the output node. A single PUF (also referred to as a PUF unit) or an array including multiple PUF units, is thereby capable of being used in both randomized and controlled programming operations.

In the randomized programming operation, the semiconductor device is configured to set both RMDs to an initial programmed state by applying combinations of a first program voltage and a reference voltage to the output node and an input of the first inverter in first and second write operations, and to reset either the first or second RMD in a third write operation, the first or second RMD being randomly determined by applying a second program voltage to the input of the first inverter while floating the output node.

In the controlled programming operation, the semiconductor device is configured to set the first and second RMDs to opposite programmed states by applying either the reference voltage or a third program voltage to the input of the first inverter and a fourth program voltage to the output node in a single write operation, the fourth program voltage having a voltage level between those of the reference and third program voltages.

The semiconductor device thereby includes a reconfigurable PUF unit or array capable of providing one or more PUF signatures and/or generating one or more random signals or numbers, as discussed below with respect to the various embodiments.

FIG. 1 is a block diagram of an IC 100, in accordance with some embodiments. IC 100 includes a semiconductor device 102 that includes a PUF 104.

IC 100 is referred to as a chip, or a microchip, and is a set of electronic circuits, or semiconductor devices, on one small flat piece (e.g., wafer, chip, or substrate) of semiconductor material, usually silicon or other suitable materials within the contemplated scope of the disclosure. IC 100 supports one or more metal oxide semiconductor field-effect transistors (MOSFETs), such as semiconductor device 102, integrated into a chip; however, other suitable transistors and electrical components are within the contemplated scope of the disclosure. IC 100 is electrically connected to, incorporates, or houses one or more semiconductor devices, such as semiconductor device 102.

Semiconductor device 102 is an electronic component or grouping of electronic components configured to use the electronic properties of one or more semiconductor materials (e.g., silicon, germanium, or gallium arsenide, as well as organic semiconductors or other suitable materials within the contemplated scope of the disclosure) for its function, such as PUF 104.

Unclonability of a PUF, e.g., PUF 104, means that each IC with a PUF has a unique and unpredictable way of mapping challenges to responses even when the design and layout between ICs are exactly the same and manufactured with the same process. The applied stimulus is called the challenge, and response is the reaction of the PUF. A challenge and its corresponding response together form a challenge-response pair (CRP). The PUF's identity is established by the properties of the microstructure itself. Such a device is resistant to spoofing attacks as this structure is not directly revealed by the challenge-response mechanism.

PUF 104 is an IC device including a microstructure configured to uniquely and unpredictably map challenges to responses, thereby supporting randomness and unpredictability for CRPs. In some embodiments, PUF 104 is reconfigurable. In some embodiments, PUF 104 is configured to be reconfigurable to change the challenges or the response behavior of PUF 104 without physically replacing the underlying PUF. In some embodiments, PUF 104 is unclonable in that each IC, such as IC 100 with a PUF, such as PUF 104, has a unique and unpredictable way of mapping challenges to responses even when the design and layout between ICs are exactly the same and manufactured with the same process. The challenge/response behavior of PUF 104 is configurable in that the challenge/response behavior of PUF 104 is not fixed, but the uniqueness remains in the manufactured hardware and is modifiable without changing the hardware.

In some embodiments, IC 100 including semiconductor device 102 includes one or more instances of PUF 104, the instances including PUF 204 discussed below with respect to FIGS. 2A-2C. In some embodiments, the instances of PUF 104 include PUF 304, discussed below with respect to FIGS. 3A-3D. In some embodiments, the instances of PUF 104 include PUF 404A-404F configured to be used for random signal generation and time sampling, as discussed below with respect to FIGS. 4A-4D.

Figure 2A:
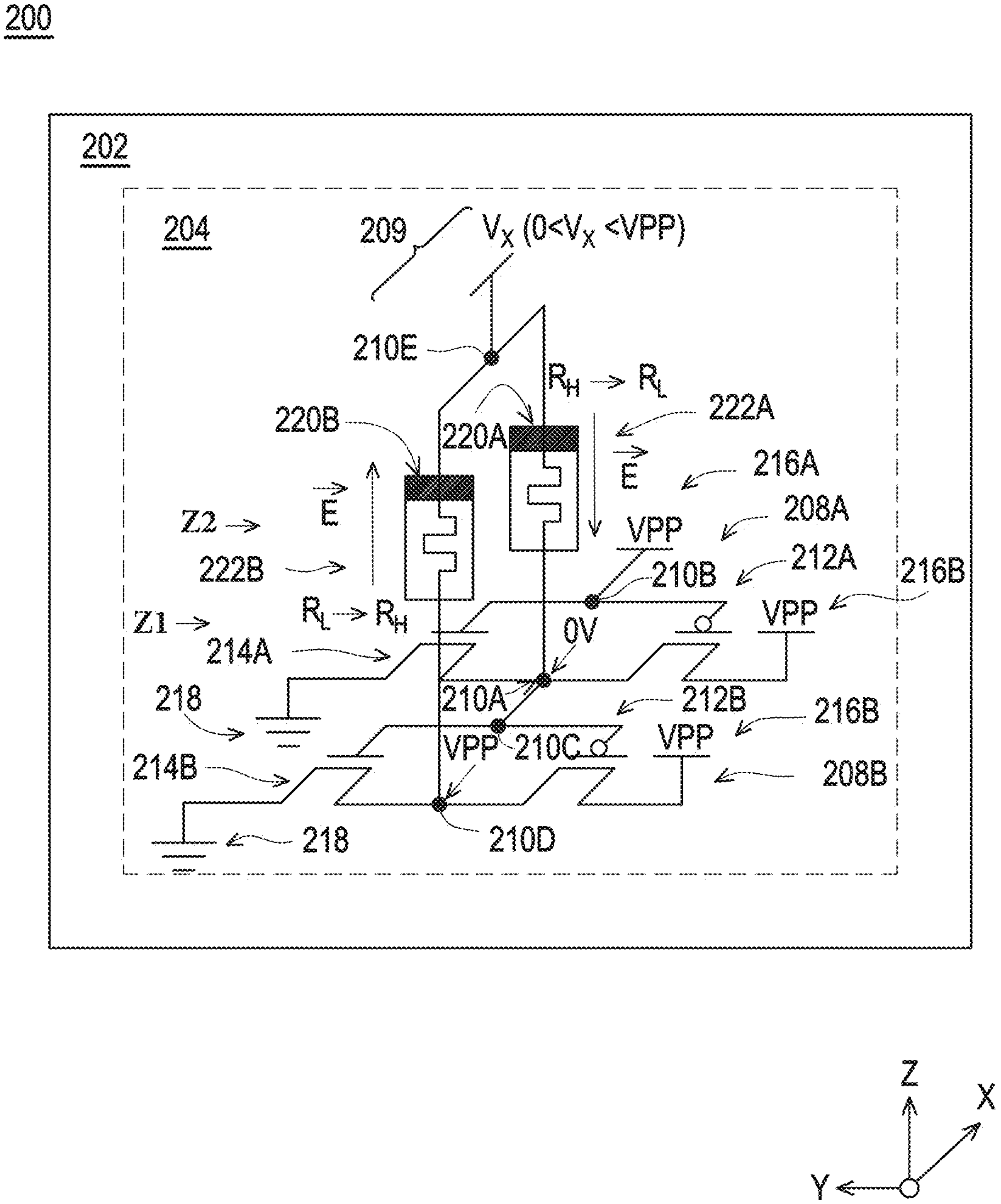
FIGS. 2A, 2B, and 2C are schematic diagrams of an IC, in accordance with some embodiments.
Figure 2B:
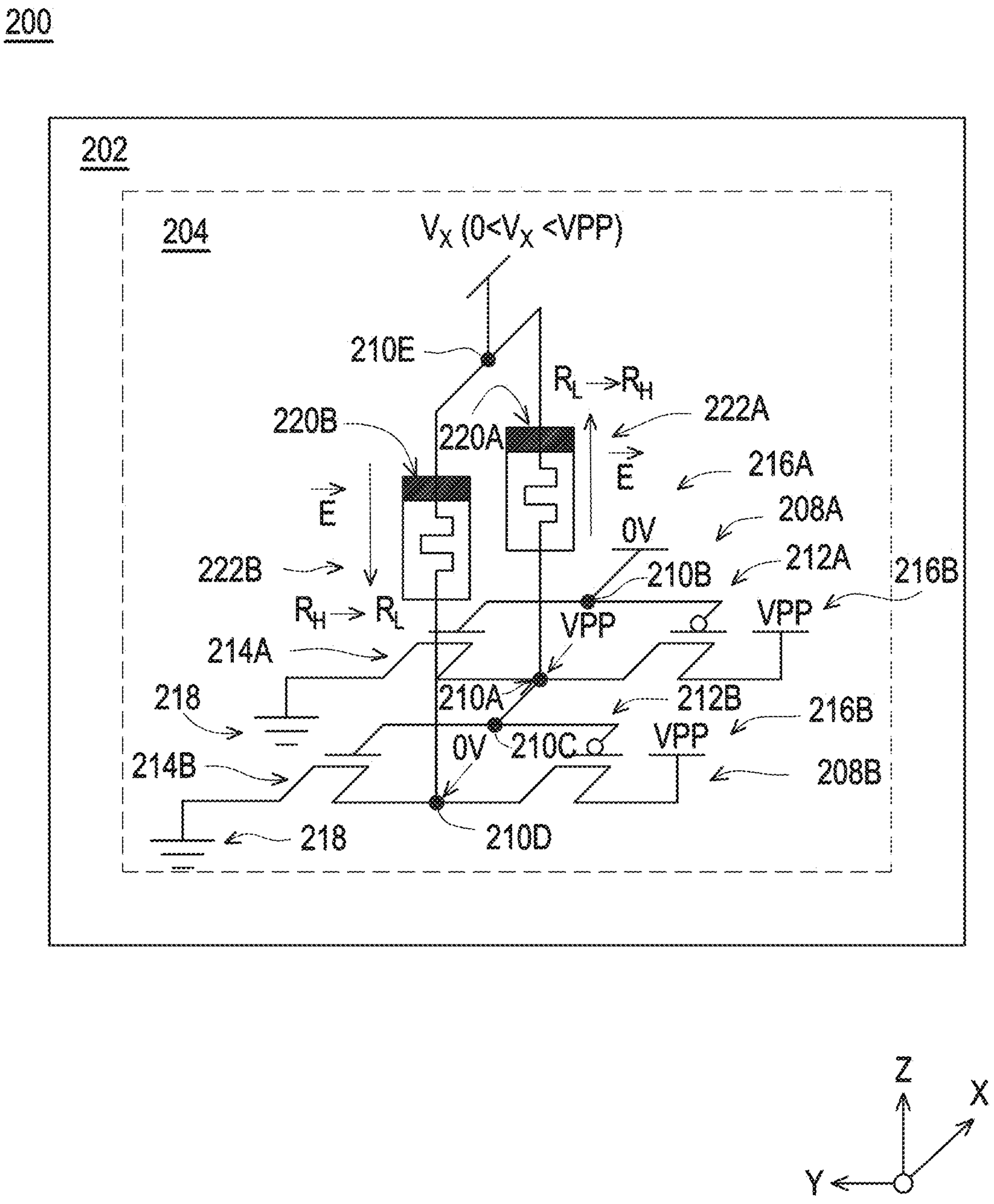
Figure 2C:
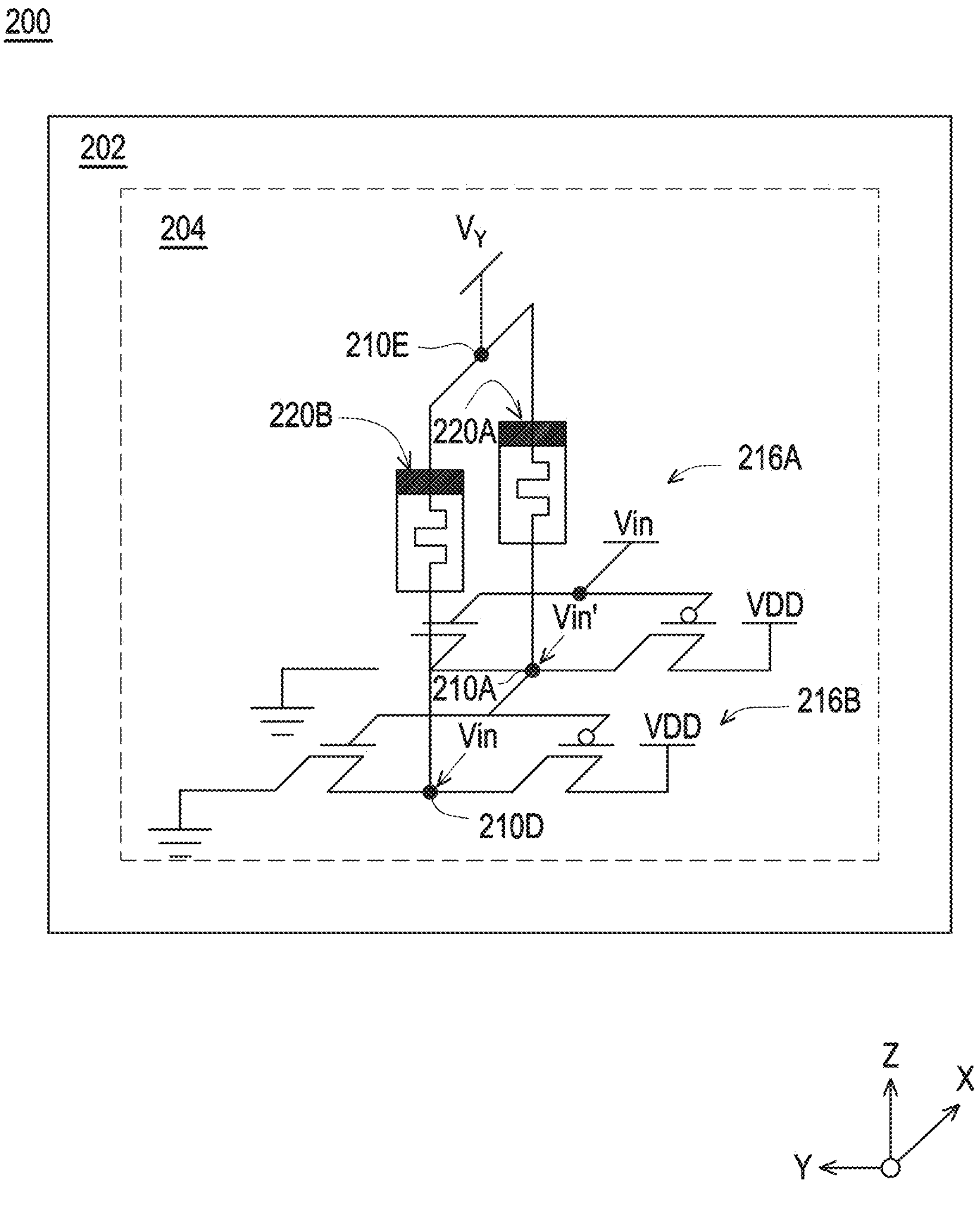

FIGS. 2A, 2B, and 2C are schematic diagrams of an IC 200, in accordance with some embodiments. IC 200 is an example of IC 100 and includes semiconductor device 202 which is an example of semiconductor device 102, and includes PUF 204 which is an example of PUF 104. Semiconductor device 202 is configured to perform write operations illustrated in FIGS. 2A and 2B and a read operation illustrated in FIG. 2C.

PUF 204 includes two inverters 208A and 208B that extend in the X-axis. Inverters 208A and 208B are electrically connected at nodes 210A and 210C. Node 210A is a common drain node of a p-type metal oxide semiconductor (PMOS) transistor 212A and an n-type metal oxide semiconductor (NMOS) transistor 214A. PMOS transistor 212A and NMOS transistor 214A further share a common gate node at a node 210B that is electrically connected to an input 216A. In some embodiments, input 216A is configured to carry one or more of a programming voltage (VPP), voltage supply that is at or near ground, a lower potential than ground, an erase voltage (VEE) to reset one or more RMDs, or a read voltage ($V_{in}$) to read the value of one or more RMDs. Other suitable voltages are within the contemplated scope of the disclosure. A pair of RMDs 209 include a RMD 220A electrically connected to node 210A of inverter 208A and a RMD 220B electrically connected to a node 210D of inverter 208B. A common output node 210E electrically connects RMDs 220A and 220B.

Inverters 208A and 208B are electrically connected at a common gate node of a PMOS transistor 212B and an NMOS transistor 214B that is node 210C. PMOS transistor 212B and NMOS transistor 214B further share node 210D, a common drain node. Each of NMOS transistors 214A and 214B is electrically connected to a ground node 218. In some embodiments, each of NMOS transistors 214A and 214B is electrically connected to a voltage source supply (VSS) that is at or near ground, a lower potential than ground, a lower potential than a programming voltage (VPP) at input 216A, a zero or negative voltage, or other suitable voltages that are within the contemplated scope of the disclosure. Each of PMOS transistors 212A and 212B is electrically connected to a voltage supply node 216B. In some embodiments, voltage supply node 216B is configured to carry a drain voltage (VDD) (FIG. 2C) that is at or near an operational voltage for PMOS transistors 212A and 212B, a positive voltage, or other suitable voltages that are within the contemplated scope of the disclosure.

In operation, inverters 208A and 208B generate output voltages at respective nodes 210A and 210D. The output voltages at nodes 210A and 210D are opposite logic-levels to input voltages at nodes 210B and 210C. For example, when an input voltage at node 210B is high (e.g., a 1 bit or VPP), the output voltage at node 210A is low (e.g., a 0 bit, 0V, or ground), the input voltage at node 210C is low (e.g., a 0 bit, 0V, or ground), and the output voltage at node 210D is high (e.g., a 1 bit or VPP).

Each of inverters 208A and 208B is constructed using a single NMOS transistor 214A, 214B connected to a single PMOS transistor 212A, 212B. In some embodiments, NMOS transistors 214A, 214B are connected through a resistor to achieve an inversion function. In some embodiments, the inverters are constructed with bipolar junction transistors (BJT) in either a resistor-transistor logic (RTL), a transistor-transistor logic (TTL) configuration, or other suitable configurations that are within the contemplated scope of the disclosure. In some embodiments, the inverters are constructed with transistors in a RMD-transistor logic.

In some embodiments, inverters 208A and 208B operate at fixed voltage levels input at nodes 210B and 210C corresponding to a logical 0 or 1 (e.g., binary low and high). In some embodiments, inverters 208A and 208B serve as a logic gate to swap between two voltage levels. In some embodiments, implementation determines the actual voltage.

Electrically connected to nodes 210A and 210D are RMDs 220A and 220B. RMDs 220A and 220B are paired, and pair of RMDs 209 are electrically connected in parallel with inverter 208B. In some embodiments, inverter 208A, the first inverter, or the inverter electrically connected to input 216A, is an inverter not in parallel with a corresponding pair of RMDs 209. That is, the output, such as output at node 210A, of a first inverter, such as inverter 208A, is the input to a first pair of RMDs 209, that are in parallel with a second inverter, such as inverter 208B. In some embodiments, first inverter 208A is connected in parallel with a corresponding pair of RMDs 209. Pair of RMDs 209 are connected together at node 210E. In some embodiments, node 210E is configured to carry a programming voltage (VPP) to program one or more RMDs, a voltage supply that is greater than zero but less than VPP, zero or ground, a voltage at or less than $V_{in}$, or other suitable voltages that are within the contemplated scope of the disclosure.

An RMD, e.g., RMD 220A or 220B, is a non-volatile memory (NVM) device including one or more resistive elements controllable to have first and second physical states corresponding to high and low resistance values (or ranges of values). High resistance values are those greater than a first threshold value and low resistance values are those less than a second threshold value less than or equal to the first threshold value. In some embodiments, the high and low resistance values correspond to respective high and low logical states, e.g., ones and zeros. In some embodiments, the high and low resistance values correspond to respective low and high logical states. In some embodiments, a ratio of the high resistance value to the low resistance value is about equal to or greater than ten.

In some embodiments, an RMD, e.g., RMD 220A or 220B, is a unipolar memory device in which the RMD is capable of being set (or reset) to each of the first and second physical states independent of a polarity of an applied voltage. In some embodiments, an RMD, e.g., RMD 220A or 220B, is a bipolar memory device in which the RMD is configured to be set to the first physical state based on a first polarity of an applied voltage, and set to the second physical state based on a second applied voltage polarity opposite the first polarity.

In the embodiment depicted in FIGS. 2A-2C, each of RMDs 220A and 220B is a unipolar memristor device, also referred to as a resistive random-access memory (RRAM) device in some embodiments. In various embodiments, a memristor includes one or more layers including one or more materials, e.g., titanium oxide ($TiO_2$), one or more polymers, carbon nanotubes, or other suitable materials, configured to be controllable to have the high and low resistance values.

In the embodiment depicted in FIGS. 2A-2C, each of RMDs 220A and 220B is a two-terminal device. In some embodiments, one or both of RMDs 220A and 220B has more than two terminals, e.g., is a three-terminal device, and semiconductor device 202 is configured to control the one or both of RMDs 220A and 220B using the one or more additional terminals, e.g., during the write and/or read operations.

The orientations of RMDs 220A and 220B depicted in FIGS. 2A-2C are non-limiting examples provided for the purpose of illustration. In some embodiments, one or both of RMDs 220A and 220B have orientations other than those depicted in FIGS. 2A-2C. In some embodiments, RMDs 220A and 220B are bipolar RMDs having opposing orientations.

In some embodiments, one or both of RMDs 220A or 220B is an RRAM other than a unipolar memristor, e.g., a bipolar RRAM device, a phase-change memory (PCM) device, a ferroelectric tunnel junction (FTJ) device, or a magnetic tunnel junction (MTJ) device.

In some embodiments, an RRAM device is a type of NVM device configured to switch between the high and low resistance values corresponding to the resistance of a dielectric material. In operation, an RRAM device controls defects, known as oxygen vacancies (oxide bond locations where the oxygen has been removed), in a thin oxide layer such that current levels vary for a given electric field strength.

In some embodiments, a PCM (otherwise known as PCME, PRAM, PCRAM, ovonic unified memory, or chalcogenide RAM in some embodiments) device is a type of NVM device including one or more materials, e.g., chalcogenide glass, configured to, in operation, respond to heat produced by the passage of an electric current through a heating element by switching between amorphous and crystalline states.

An FTJ device is a type of NVM device including one or more ferroelectric materials that have an electric polarization reversible by the application of an external electric field. In operation, the polarization of the one or more ferroelectric materials corresponds to a hysteresis effect whereby the high and low resistance values are obtained.

An MTJ device is a type of NVM device including two ferromagnetic layers separated by a thin insulator and configured to use tunnel magnetoresistance (TMR) to switch between states in which magnetization directions of the two layers are either aligned or perpendicular, thereby obtaining the high and low resistance values in operation.

In some embodiments, a NOT (FIG. 2A) logic state or a YES (FIG. 2B) logic state is written into a PUF, such as PUF 204, by a set/reset of the resistance values of RMDs 220A and 220B. In the NOT logic state, PUF 204 is thereby configured as a NOT gate, or inverter, in which an input signal is inverted to generate an output signal in operation, as discussed below. In the YES logic state, PUF 204 is thereby configured as a YES gate, or buffer, in which an input signal is maintained to generate an output signal in operation, as discussed below. In some embodiments, the pair of RMDs 209 including opposite states is thereby configured to provide a data storage function in operation.

In the write operation illustrated in FIG. 2A, during a set/reset operation for a NOT logic state, the voltage at input 216A and node 216B is set to VPP and voltage Vx at node 210E is set to a value between VPP and ground such that the voltage at node 210D is VPP greater than voltage Vx at node 210E. A direction of an electric field intensity 222B at RMD 220B is upward towards node 210E from node 210D, current flows from node 210D to 210E in the direction of electric field intensity 222B, and the resistance of RMD 220B is modified from $R_L$ to $R_H$ (e.g., a reset operation).

Continuing with the example of FIG. 2A, the voltage at node 210A is 0V as it is the inverted signal applied at node 210B which is VPP. A direction of an electric field intensity 222A at RMD 220A is downward from node 210E to node 210A, current flows from node 210E to node 210A in the direction of electric field intensity 222A, and the resistance of RMD 220A is modified from $R_H$ to $R_L$ (e.g., a set operation).

In the embodiment depicted in FIG. 2A, voltage Vx is set to a level between VPP and ground configured to generate each of electric field intensities 222A and 222B having values corresponding to the set and reset operations. In some embodiments, each of RMDs 220A and 220B is a unipolar RMD and electric field intensity 222A is greater than, e.g., twice, or less than, e.g., half, of electric field intensity 222B. In some embodiments, each of RMDs 220A and 220B is a bipolar RMD and electric field intensity 222A is approximately equal to, greater, or less than electric field intensity 222B, and the set and reset operations correspond to RMDs 220A and 220B having polarities opposite those of electric field intensities 222A and 222B.

In some embodiments, the directions and magnitudes of electric field intensities 222A and 222B as shown in FIG. 2A act to program PUF 204 to a NOT logic state. In the read operation illustrated in FIG. 2C, with PUF 204 programmed to the NOT logic state, when the input at input 216A is zero or low, an output voltage $V_Y$ at node 210E is high based on current flowing from node 210A, through RMD 220A, through node 210E and back to node 210D. In some embodiments, voltage $V_Y$ is represented by equation (1).

$$V_Y = V_{in} - (I \cdot R_{220A}) \approx V_{in} \quad (1)$$

In some embodiments, as the resistance of RMD 220A is low $R_L$, the voltage drop across RMD 220A is small and thus the voltage $V_Y$ at 210E is substantially close to $V_{in}$, a voltage greater than zero, or a 1 bit. In some embodiments, $V_{in}$ is less than VPP. In some embodiments, $V_{in}$ is 10 times smaller than VPP. In some embodiments, $V_{in}$ is less than VPP so that electric field intensities 222A and 222B are not changed, thus changing the resistance of RMDs 220A, 220B and altering PUF 204.

In some embodiments, when the voltage at input 216A is $V_{in}$ or high, the voltage at node 210A is 0, and the voltage at node 210D is $V_{in}$. In some embodiments, output voltage $V_Y$ at node 210E is 0V or low as the resistance at RMD 220B is high. In some embodiments, the voltage at node 210E is represented by equation (2).

$$V_Y = V_{in} - (I \cdot R_{220B}) \approx 0 \quad (2)$$

In some embodiments, the voltage drop across RMD 220B is nearly $V_{in}$ and thus, $V_Y$ or node 210E is almost zero.

In the write operation illustrated in FIG. 2B, during a set/reset operation for a YES logic state, the voltage at input 216A is set to 0V, the voltage at node 216B is set to VPP, and voltage Vx at node 210E is set to a value between VPP and ground such that the voltage at node 210A is VPP greater than voltage Vx at node 210E.

Electric field intensity 222A at RMD 220A is directed from node 210A to node 210E, current flows from node 210A to node 210E in the direction of electric field intensity 222A. The current flow modifies the resistance of RMD 220A from $R_L$ to $R_H$ as the programming voltage, VPP, is high enough to alter the resistance of RMD 220A. Electric field intensity 222B is directed from node 210E to 210D and the resistance of RMD 220B is modified from $R_H$ to $R_L$.

The directions and magnitudes of electric field intensities 222A and 222B as shown in FIG. 2B programs PUF 204 to a YES logic state. In the read operation illustrated in FIG. 2C, with PUF 204 programmed to the YES logic state, when $V_{in}$ at input 216A is zero or a low voltage, the voltage at node 210A is $V_{in}$. In some embodiments, output voltage $V_Y$ at node 210E is 0V or low as the resistance at RMD 220A is high. In some embodiments, voltage $V_Y$ is represented by equation (3).

$$V_Y = V_{in} - (I \cdot R_{220A}) \approx 0 \quad (3)$$

In some embodiments, the voltage drop across RMD 220A is nearly $V_{in}$ and thus $V_Y$ is zero or nearly zero. In some embodiments, when the voltage at input 216A is $V_{in}$ or high, the voltage at node 210A is zero and the voltage at node 210D is $V_{in}$. As the resistance at RMD 220B is low, the voltage drop across RMD 220B is small and node 210E is nearly $V_{in}$ or high. Thus, for the YES logic state, in operation, the voltage in corresponds to the voltage out, only slightly delayed as in a buffer.

In the embodiment depicted in FIG. 2B, voltage Vx is set to a level between $V_{PP}$ and ground configured to generate each of electric field intensities 222A and 222B having values corresponding to the set and reset operations. In some embodiments, each of RMDs 220A and 220B is a unipolar RMD and electric field intensity 222A is greater than, e.g., twice, or less than, e.g., half, of electric field intensity 222B. In some embodiments, each of RMDs 220A and 220B is a bipolar RMD and electric field intensity 222A is approximately equal to, greater, or less than electric field intensity 222B, and the set and reset operations correspond to RMDs 220A and 220B having polarities opposite those of electric field intensities 222A and 222B.

Figure 3A:
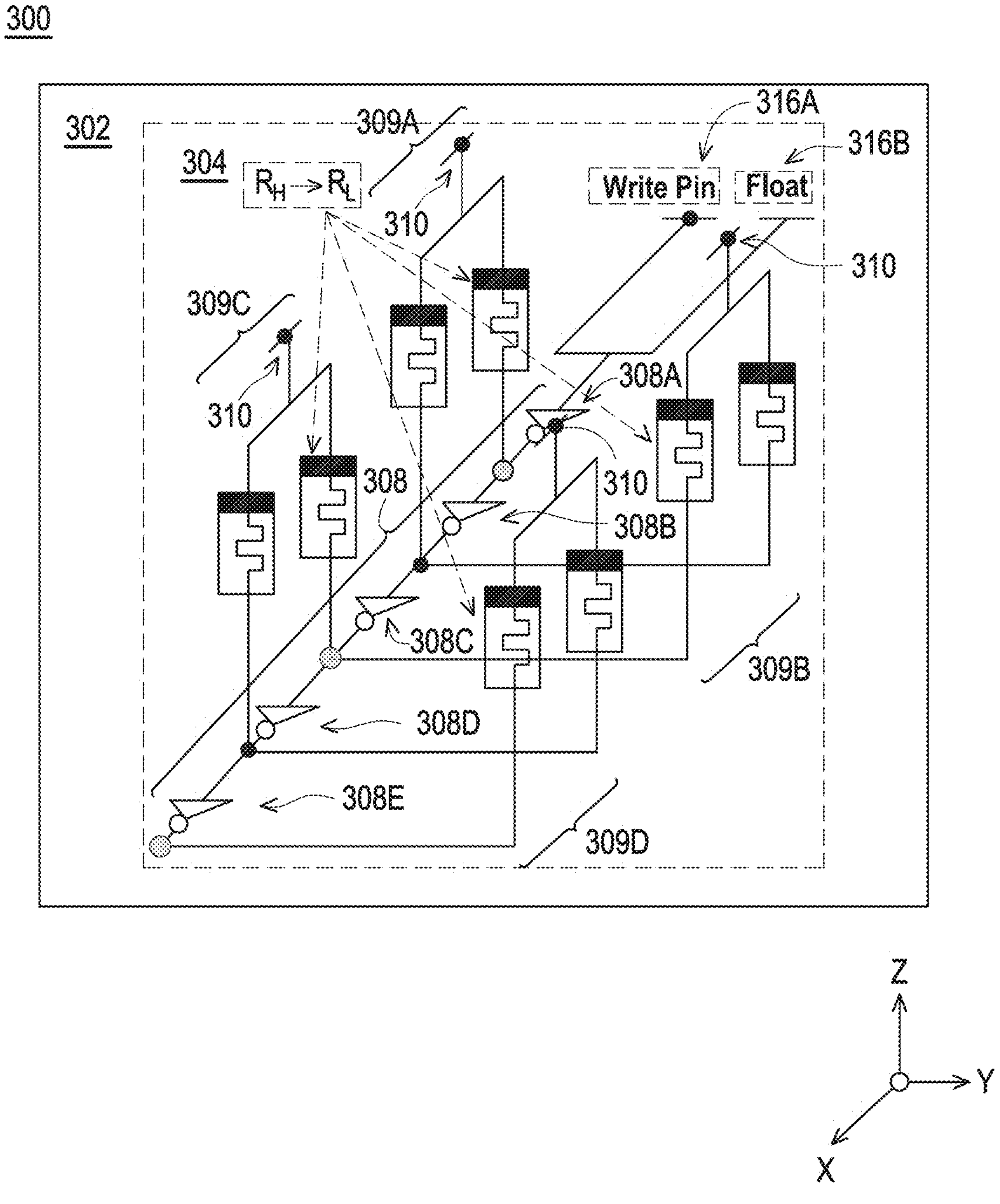
FIGS. 3A, 3B, 3C, and 3D are schematic diagrams of an IC, in accordance with some embodiments.
Figure 4A:
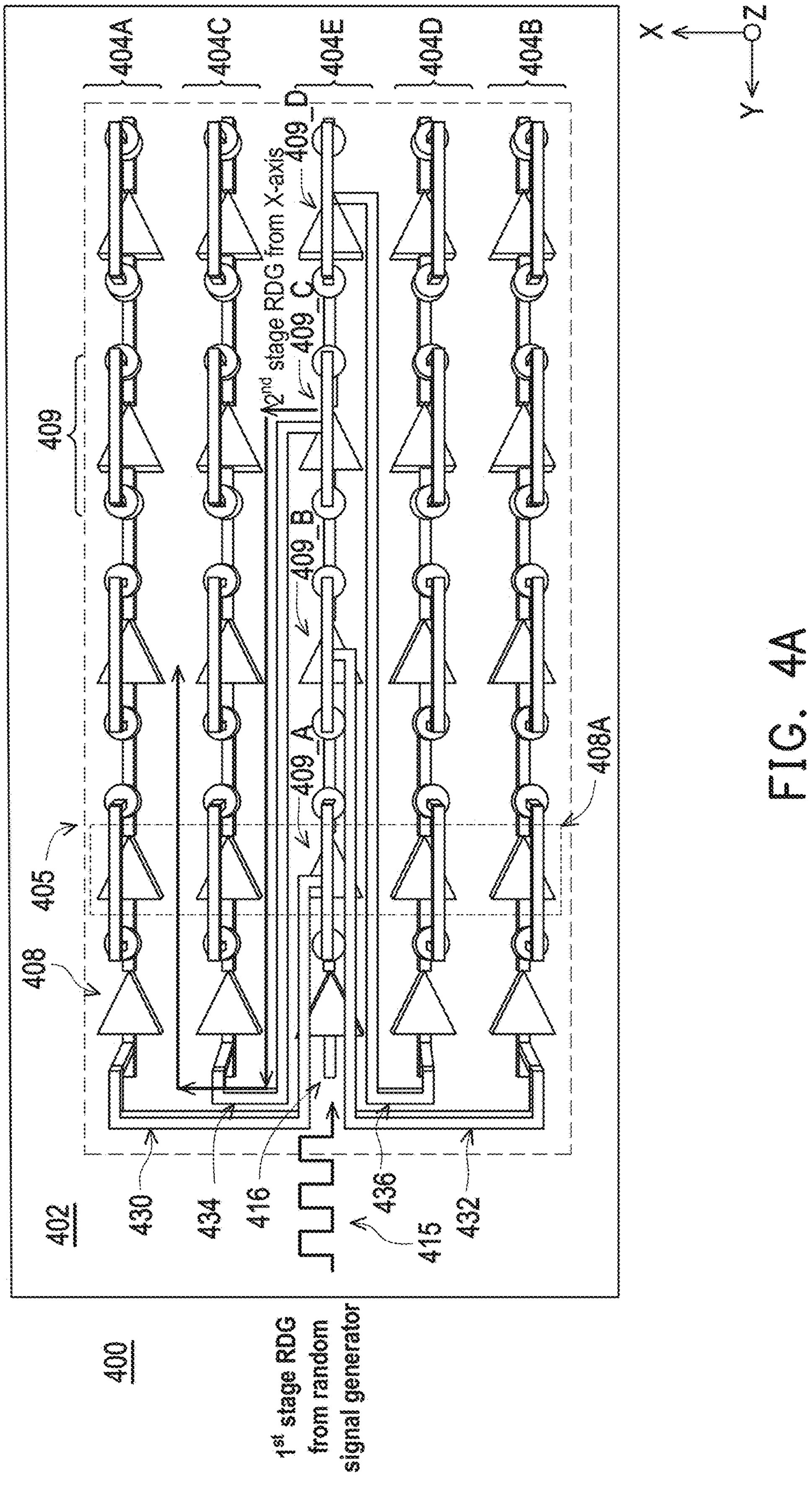
FIGS. 4A, 4B, and 4C are schematic diagrams of an IC, in accordance with some embodiments.

In some embodiments, inverters 208A and 208B are in a transistor level Z1, or a first level Z1. In some embodiments, RMDs 220A and 220B are in a RMD level Z2, or second level Z2, overlying the first level Z1. In some embodiments, other suitable configurations are within the contemplated scope of the disclosure, such as RMDs 220A and 220B located in the first level Z1 and inverters 208A and 208B located in the second level Z2 overlying the first level Z1. In some embodiments, additional inverters, such as inverters 208A and 208B, and additional pairs for RMDs, such as pair of RMDs 209, are added to existing inverters 208A and 208B and existing pair of RMDs 209 (FIG. 3A). In some embodiments, multiple rows of inverters extending in the X-axis are separated by a distance in the Y-axis (FIG. 4A). In some embodiments, multiple pairs of RMDs extending from the multiple rows of inverters are located in a second, third, fourth, and Nth level (where N is a non-negative integer) (FIG. 4C—not labeled). In some embodiments, multiple columns of inverters (e.g., in the 1st, 3rd, 5th, and N−1 level, where N is a non-negative integer) are electrically connected to multiple pairs of RMDs located in a second, fourth, sixth, and Nth level (FIG. 4C—not labeled). In some embodiments, multiple rows of inverters with multiple pairs of RMDs are located below other multiple rows of inverters with multiple pairs of RMDs in a stacking fashion vertically (see FIG. 4A).

By the configuration discussed above, IC 200 including semiconductor device 202 includes PUF 204 capable of being controllably programmed to the NOT and YES logic states. As discussed below with respect to FIGS. 3A-3D, PUF 204, e.g., by being included in PUF 304, is further capable of being randomly programmed to one of the NOT or YES logic states.

FIGS. 3A, 3B, 3C, and 3D are schematic diagrams of an IC 300, in accordance with some embodiments. IC 300 is an example of IC 100 and includes semiconductor device 302 which is an example of semiconductor device 102, and includes PUF 304 which is an example of PUF 104. Semiconductor device 302 is configured to perform write operations illustrated in FIGS. 3A-3C and a read operation illustrated in FIG. 3D.

In the embodiment depicted in FIGS. 3A-3D, PUF 304 includes an array of inverters 308A-308E (collectively set of inverters 308) and pairs of RMDs 309A-309D that correspond to inverters 208A and 208B and pairs of RMDs 209, respectively, discussed above with respect to FIGS. 2A-2C. The depiction of set of inverters 308 is simplified for the purpose of clarity.

In some embodiments, PUF 304 is a unipolar 4-bit array. In some embodiments, PUF 304 is an example of PUF 204 with the exception of additionally connected inverters 308C, 308D, and 308E and additional pairs of RMDs 309B, 309C, and 309D in parallel with the additional inverters 308C, 308D, and 308E. In some embodiments, pairs of RMDs 309A, 309C extend in the Z-axis and are in another layer or level from set of inverters 308. In some embodiments, PUF 304 includes set of inverters 308 that extend in the X-axis and include inverters 308A, 308B, 308C, 308D, and 308E. In some embodiments, RMDs 309B, 309D extend in both the Y and Z-axis in another layer or level from set of inverters 308.

Inverter 308A is electrically connected to a write line 316A that is configured for programming PUF 304 as discussed in detail below. Inverter 308A is further electrically connected to a read line 316B that is configured for reading the state or bits of pairs of RMDs 309A, 309B, 309C, and 309D (hereinafter pairs of RMDs 309) as discussed in detail below. In some embodiments, PUF 304 is a bipolar 4-bit array.

Set of inverters 308 are electrically connected serially with pairs of RMDs 309 electrically connected in parallel with each of inverters 308B, 308C, 308D, and 308E. In various embodiments, each RMD of the pair of RMDs 309 is a unipolar or bipolar RMD as discussed above with respect to FIGS. 2A-2C.

In some embodiments, stochastic switching characteristics in each RMD within pairs of RMDs 309 produce a randomness for PUF 304, as discussed below. In some embodiments, stochastic refers to the property of being described by a random probability distribution. In some embodiments, although stochasticity and randomness are distinct in that the former often refers to a modeling approach and the latter often refers to phenomena, these two terms are used interchangeably. In some embodiments, a stochastic process is further referred to as a random process.

In some embodiments, two write operations or two programming operations (in contrast to the single programming operations of FIGS. 2A and 2B) are performed to set each RMD of pairs of RMDs 309 to a low resistance $R_L$. In some embodiments, a first write operation is shown in FIG. 3A. Programming voltage VPP is applied to write line 316A and to each of output nodes 310 to set a first RMD of pair of RMDs 309 to a low resistance $R_L$ (a set operation). In some embodiments, programming voltage VPP is applied to write line 316A to set a single RMD of each pair of RMDs 309 to $R_L$ as indicated by each dotted arrow pointing to the RMD to be changed from $R_H$ to $R_L$. The output of inverters 308A, 308C, and 308E is 0V or near zero volts. In some embodiments, each RMD electrically connected to the output of inverters 308A, 308C, and 308E is set from $R_H$ to $R_L$. In some embodiments, each RMD electrically connected to the output of inverters 308B and 308D remain at $R_H$ or a previous state as there is no significant voltage difference between the output of inverters 308B and 308D and the voltage at output nodes 310 (e.g., both are at programming potential VPP). In some embodiments, each RMD of the pairs of RMDs 309 that experiences a voltage difference of at or near VPP between an inverter output and an output node 310 has the resistance of the RMD modified from $R_H$ to $R_L$. In some embodiments, each RMD of the pairs of RMDs 309 that experiences a voltage difference of at or near zero between an inverter output and an output node 310 does not have the resistance of the RMD modified.

Figure 3B:
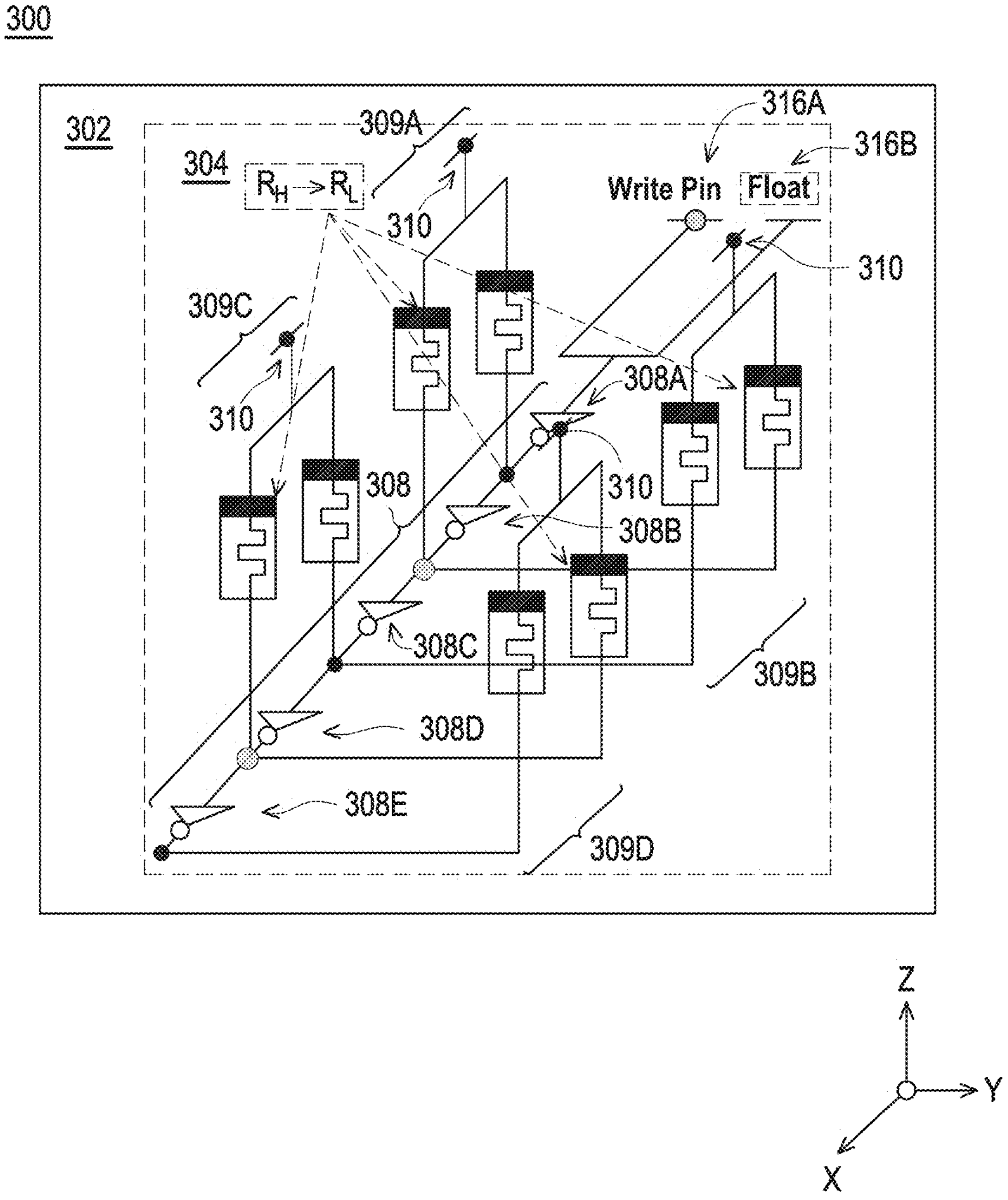

In some embodiments, a second write operation is shown in FIB. 3B. Zero volts is applied at write line 316A and the programming voltage VPP is applied to each of output nodes 310 to set a single RMD of each pairs of RMDs 309 to a low resistance RI. (e.g., a set operation). In some embodiments, the RMDs are set to a low resistance in the write operation of FIG. 3B are the RMDs which were unaffected in the write operation discussed with reference to FIG. 3A.

In some embodiments, 0V is applied to write line 316A to modify (reconfigure) the resistance of one RMD of each pairs of RMDs 309 to $R_L$ as indicated by each dotted arrow pointing to the RMD to be changed from $R_H$ to $R_L$. The output of inverters 308B and 308D is 0V or near zero volts. In some embodiments, each RMD electrically connected to the output of inverters 308B and 308D is set from $R_H$ to $R_L$. In some embodiments, each RMD electrically connected to the output of inverters 308A, 308C, and 308E remain at $R_L$ or a previous state as there is no significant voltage difference between the output of inverters 308A, 308C, and 308E and the voltage at output nodes 310 (e.g., both are at programming potential VPP). In some embodiments, each RMD of the pair of RMDs 309 that experiences a voltage difference of at or near VPP between an inverter output and an output node 310 has the resistance of the RMD modified from $R_H$ to $R_L$. In some embodiments, each RMD of the pair of RMDs 309 that experiences a voltage difference of at or near zero between an inverter output and an output node 310 does not have the resistance of the RMD modified.

In some embodiments, after each of the pairs of RMDs 309 are set (e.g., the resistance is modified from $R_H$ to $R_L$), erase voltage VEE is applied to write line 316A and each output node 310 is allowed to float. Voltage outputs of successive inverters of set of inverters 308 corresponding to erase voltage VEE are thereby applied to a series connection of the RMDs in each pair of RMDs 309A-309D. In response to the applied erase voltage VEE, current (represented by the example of arrows 330 around pair of RMDs 309C) flows through each pair of RMDs 309.

Because the two RMDs of a given pair of RMDs 309 are non-identical based on manufacturing variations, applied voltage VEE causes a first one of the two RMDs to be reset to the high resistance $R_H$ before the second one of the two RMDs is reset to the high resistance $R_H$. In some embodiments, the random nature of the reset operation is due to the structural characteristic of the RMDs. For example, each RMD is manufactured with random structural variations whereby the first one of the two RMDs has a lower threshold voltage than that of the second one of the two RMDs in order to be reset (e.g., changed to a high resistance $R_H$).

Accordingly, the programmed states of the bits of PUF 304 are based on the uniqueness of the physical microstructure of each RMD. The PUF microstructure is based on random physical factors of pairs of RMDs 309 introduced during manufacturing. In some embodiments, the factors are unpredictable and uncontrollable, which makes it virtually impossible to duplicate or clone the structure. In some embodiments, PUF 304 is thereby configured such that when a physical stimulus is applied to PUF 304, PUF 304 reacts in an unpredictable (but repeatable) way due to the complex interaction of the stimulus with the physical microstructure of pair of RMDs 309. In some embodiments, the microstructure of pair of RMDs 309 depends on physical factors introduced during manufacturing. In some embodiments, PUF 304 thereby has an identity established by the properties of pair of RMDs 309. In some embodiments, PUF 304 is thereby resistant to spoofing attacks.

In some embodiments, the current through a given pair of RMDs 309 decreases significantly once the single RMD is reset such that the reset operation stops. In some embodiments, the current is configured to reset one RMD of each pair of RMDs 309. In some embodiments, a single RMD of each pair of RMDs 309 is reset by controlling erase voltage VEE. In some embodiments, a single RMD of each pair of RMDs 309 is reset by controlling erase voltage VEE and an amount of time erase voltage VEE is applied to write line 316A. In some embodiments, $R_H$ is a 1 bit and $R_L$ is a 0 bit, then a pair of RMDs 309 is configured for a 1 bit representation of (1,0). In some embodiments, each pair of RMDs 309 is configured to represent a single bit of either a 1 or 0.

Figure 3C:
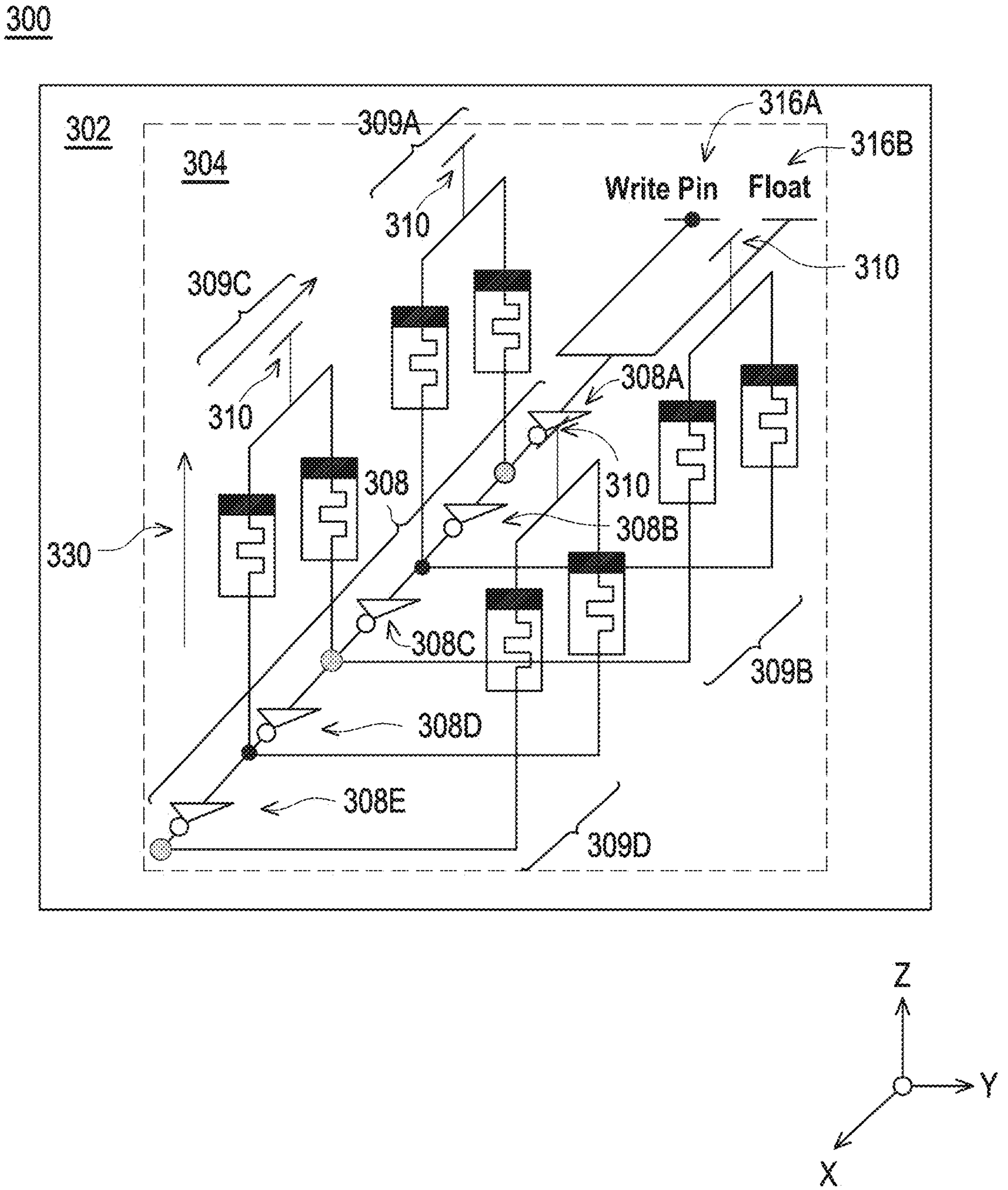
Figure 3D:
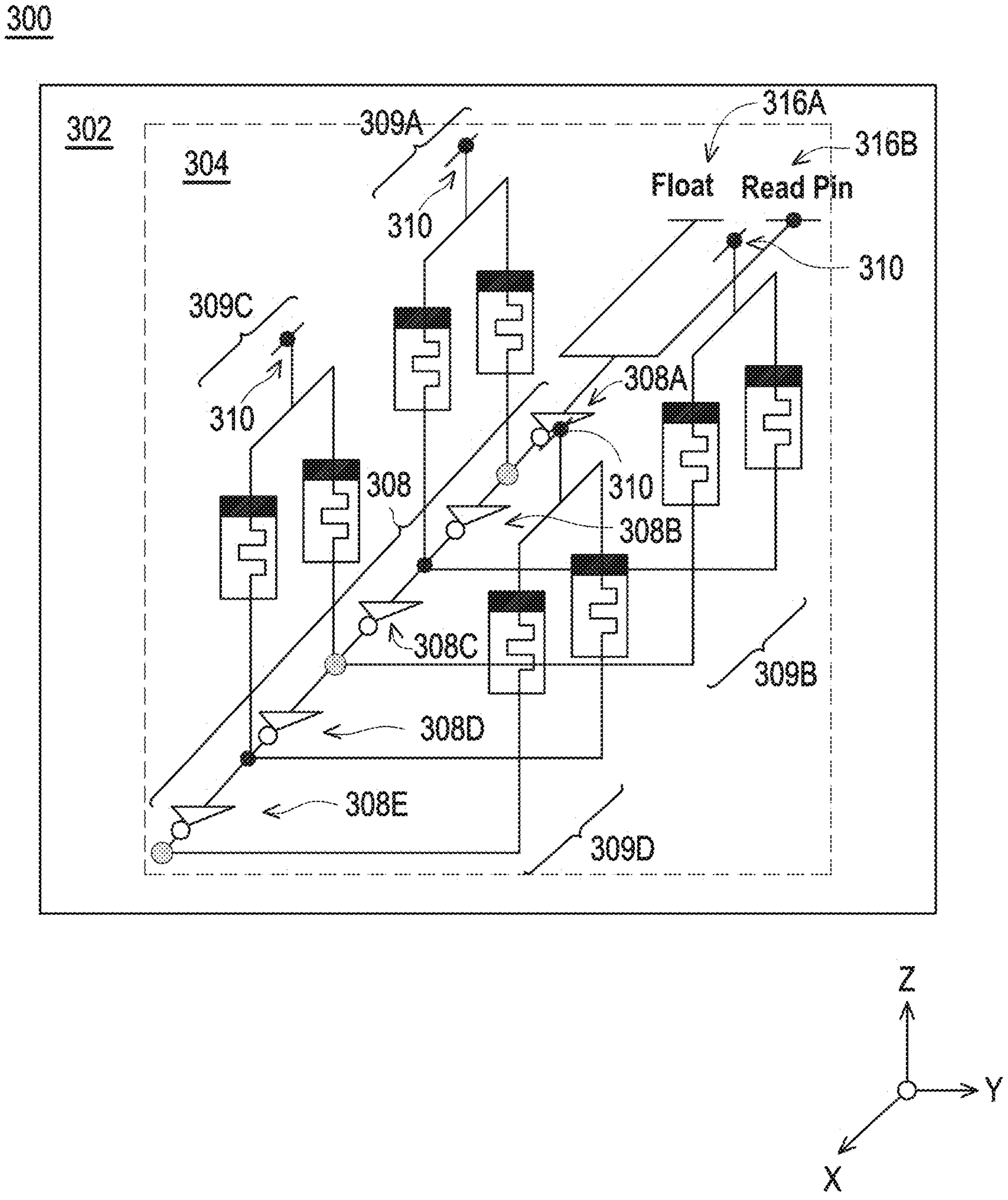

In the read operation illustrated in FIG. 3D, with PUF 304 programmed to the randomized logic states, a physical stimulus applied to PUF 304 causes PUF 304 to react in an unpredictable (but repeatable) way due to the interaction of the stimulus ($V_{in}$) at read line 316B with the physical microstructure of PUF 304. In some embodiments, the applied stimulus ($V_{in}$) is called the challenge, and response (output at nodes 310) is the reaction of PUF 304. A challenge and its corresponding response together form a CRP.

In some embodiments, to read PUF 304, when a challenge (read voltage, $V_{in}$) is applied to PUF 304 at read line 316B, the response is at output nodes 310. In some embodiments, a first subset of output nodes 310 are at the challenge voltage (e.g., $V_{in}$ or a 1) and a second subset of output nodes 310 are low (e.g., at or near 0V or a 0).

In some embodiments, when the challenge voltage is at or near 0V the first subset of output nodes 310 are at the challenge voltage (e.g., 0V) and the second subset of output nodes 310 are high (e.g., at or near $V_{in}$).

In some embodiments, the outputs at nodes 310 provide a random 4-bit response (e.g., 0111, 1011, 1101, 1110, 1000, 0100, 0010, or 0001) in which the output is randomly determined by which RMD of each pair of RMDs 309 was reconfigured from $R_L$ to $R_H$. The number of bits included in PUF 304 is a non-limiting example provided for illustration. In some embodiments, PUF 304 includes fewer or greater than four bits.

In some embodiments, the bits of PUF 304 of semiconductor device 302 are independent and thereby capable of being either controllably programmed as discussed above with respect to FIGS. 2A-2C or randomly programmed as discussed above. Semiconductor device 302 is thereby capable of generating outputs having selectable numbers of randomly programmed bits and/or controllably programmed bits.

In some embodiments, semiconductor device 302 is configured to perform a sequential read operation on PUF 304 in which the sequentially read bits are used to generate an output signal. Because the bits are randomized, the output signal is thereby configured as a random signal, and PUF 304 is thereby configured as a random number generator based on the random RMD of each pair of RMDs 309 being reset to $R_H$.

FIGS. 4A, 4B, 4C, and 4D are schematic diagrams of an IC 400, in accordance with some embodiments. IC 400 is an example of IC 100 and includes semiconductor device 402 which includes a random number generator (RNG) 405. In some embodiments, RNG 405 is an example of semiconductor device 102. RNG 405 includes PUF arrays 404A, 404B, 404C, 404D, and 404E. Each of PUF arrays 404A, 404B, 404C, 404D, and 404E is an example of PUF 304.

RNG 405 includes several PUF arrays 404A, 404B, 404C, 404D, and 404E. In some embodiments, each of PUF arrays 404A, 404B, 404C, 404D, and 404E includes N inverters 408, where N is a positive integer, and (N−1) pairs of RMDs 409 where each pair of RMDs 409 is in parallel with an inverter 408 except for the first inverter, beginning instead with group of second inverters 408A. In some embodiments, PUF arrays 404A, 404B, 404C, 404D, and 404E include different numbers of inverters and different numbers of pairs of RMDs 409. Other suitable inverter and RMD configurations are within the contemplated scope of the disclosure.

In the various embodiments depicted in FIGS. 4A-4D, some or all of the PUF arrays, e.g., PUF arrays 404A, 404B, 404C, 404D, or 404E, are randomly programmed, e.g., as discussed above with respect to FIGS. 3A-3D, prior to application of an input 416, as discussed below.

In some embodiments, input 416 is a direct current (DC) voltage, e.g., voltage $V_{PP}$, voltage VDD, or a ground voltage, and IC 400 is configured as discussed below as a three-dimensional (3D) random number generator in the manner discussed above with respect to FIGS. 3A-3D.

In some embodiments, input 416 is a random signal 415 from a random signal generator, e.g., semiconductor device 302 discussed above with respect to FIGS. 3A-3D, that produces random signal 415 over time (e.g., a first dimension). In some embodiments, an output of a first RMD pair 409_A of PUF array 404E is routed through a conductor 430 to PUF array 404A. In some embodiments, an output of a second RMD pair 409_B of PUF array 404E is routed through a conductor 432 to PUF array 404B. In some embodiments, an output of a third RMD pair 409_C of PUF array 404E is routed through a conductor 434 to PUF array 404C. In some embodiments, an output of a fourth RMD pair 409_D of PUF array 404E is routed through a conductor 436 to PUF array 404D.

In some embodiments, random signal 415 at input 416 is considered a first stage randomness (RDG) and the outputs from PUF array 404E in the X-axis are considered to be second stage randomness based on the outputs passing through PUF arrays 404A, 404B, 404C, and 404D. In some embodiments, RNG 405 thereby includes two stages of random number generation, the first random generation being based on time by a random signal generator and the second random number generation being based on PUF arrays 404A, 404B, 404C, and 404D offset from PUF array 404E in the X-axis. In some embodiments, the randomness of RNG 405 produces a second dimension (2D) of randomness (e.g., time, X) over PUF 304.

Figure 4B:
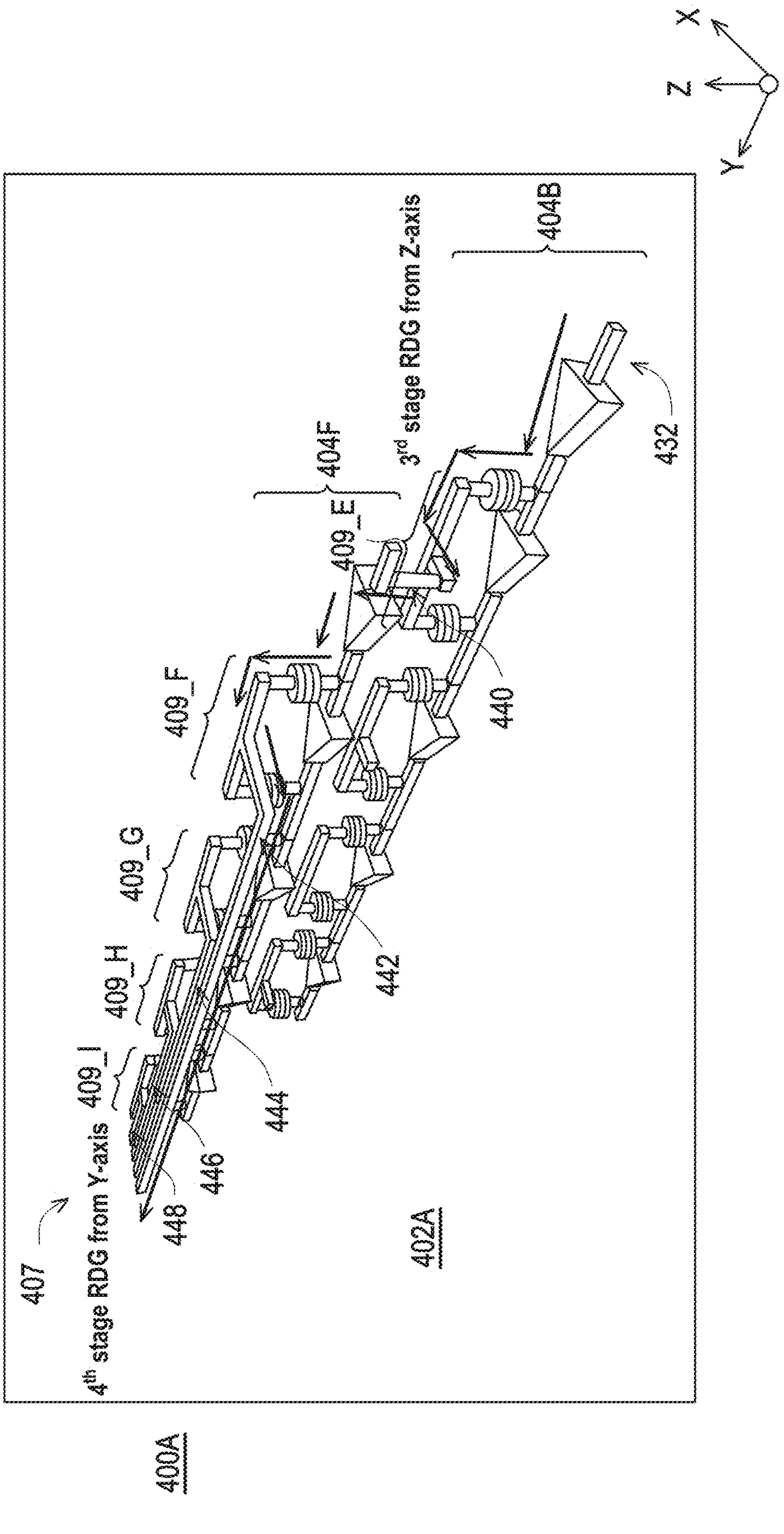
Figure 4C:
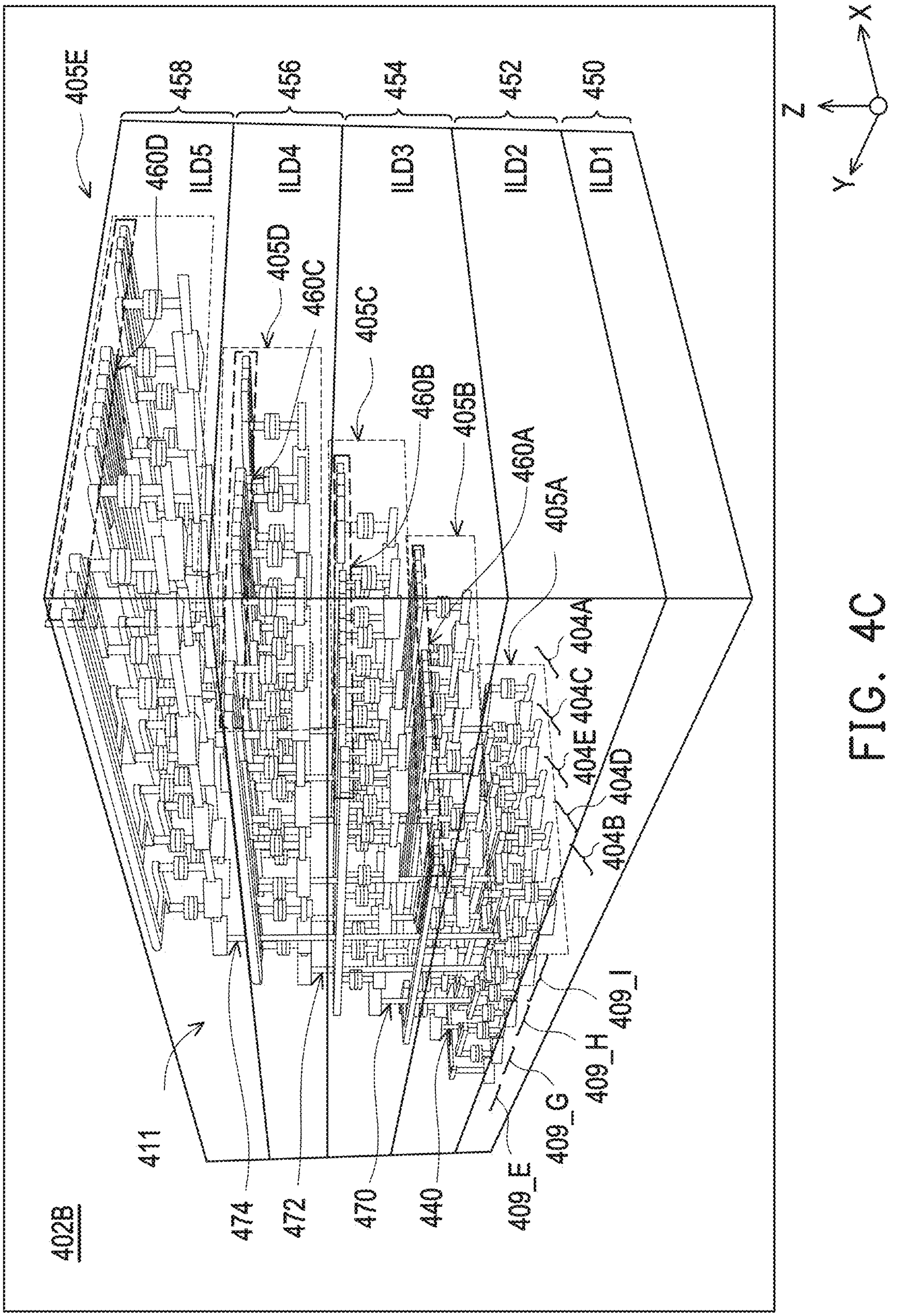

FIG. 4B is a schematic diagram of an IC 400A, in accordance with some embodiments. IC 400A is an example of IC 100 and includes semiconductor device 402A which is an example of RNG 405 and includes a RNG 407. RNG 405 includes PUF array 404B discussed above with respect to FIG. 4A, and a PUF array 404F. PUF array 404F is an examples of PUF 304.

In some embodiments, RNG 407 includes PUF array 404F separated from PUF array 404B in the Z-axis. In some embodiments, RNG 407 is a subset of PUF arrays of RNG 411 (FIG. 4C). In some embodiments, PUF array 404B receives an input at conductor 432 from pair of RMDs 409_B that has already be through two dimensions of randomness.

In some embodiments, an output of the first RMD pair 409_E of PUF array 404B is routed through a conductor 440 to PUF array 404F. In some embodiments, each of PUF arrays 404A, 404B, 404C, and 404D of RNG 405 output a signal from their respective first RMD pair 409_E to another PUF array, such as PUF array 404F offset in the Z-axis. In some embodiments, the routing of the random signal from PUF array 404B to PUF array 404F in the Z-axis produces a third dimension (3D) of randomness (e.g., time, X, Z). In some embodiments, outputs of RMD pairs 409_F, 409_G, 409_H, and 409_I of PUF array 404F are routed through conductors 442, 444, 446, and 448 in the Y-axis. In some embodiments, semiconductor device 402A including PUF array 404F is thereby configured to produce a fourth dimension (4D) of randomness (e.g., time, X, Y, Z). In some embodiments, semiconductor device 402A is configured to generate random numbers based on the four stages or four dimensions of randomness RDG in RNG 407 corresponding to increased entropy compared to random numbers based on fewer than four stages. In some embodiments, semiconductor device 402A including a four dimensional (4D) PUF is thereby capable of continuously outputting random numbers based on locations and time (x, y, z, time).

FIG. 4C is a schematic diagram of an IC 400B, in accordance with some embodiments. IC 400B is an example of IC 100 and includes semiconductor device 402B which includes a RNG 411 and RNGs 405A, 405B, 405C, 405D, and 405E that are examples of RNG 405.

RNGs 405A, 405B, 405C, 405D, and 405E are stacked in the Z direction. RNG 405A includes instances of PUF arrays 404A, 404B, 404C, 404D, and 404E, discussed above, and each of RNGs 405B, 405C, 405D, and 405E includes instances of PUF arrays 404A, 404B, 404C, and 404D.

RNG 411 includes levels of inter-layer dielectric (ILD) 450, 452, 454, 456, and 458. Each ILD 450, 452, 454, 456, and 458 includes a corresponding one of RNG 405A, 405B, 405C, 405D, or 405E. In some embodiments, RNG 411 corresponds to multiple instances of RNG 405 in that each of ILDs 450, 452, 454, 456, and 458 includes an RNG corresponding to RNG 405. In some embodiments, RNGs 405B, 405C, 405D, and 405E do not include PUF array 404E. In some embodiments, RNG 411 corresponds to multiple instances of RNG 407 in that RNGs 405B, 405C, 405D, and 405E in ILDs 452, 454, 456, and 458 are electrically connected and outputs from PUF arrays 404A, 404B, 404C, and 404D are inputted to RNGs 405B, 405C, 405D, and 405E.

An output of a first pair of RMD 409_E in each of PUF arrays 404A, 404B, 404C, and 404D is electrically connected through conductor 440 to an input in corresponding PUF arrays 404A, 404B, 404C, and 404D in RNG 405B in ILD 452. An output of a second pair of RMD 409_G in each of PUF arrays 404A, 404B, 404C, and 404D of RNG 405A is electrically connected through a conductor 470 to an input in corresponding PUF arrays 404A, 404B, 404C, and 404D of RNG 405C in ILD 454. An output of a third pair of RMD 409_H in each of PUF arrays 404A, 404B, 404C, and 404D is electrically connected by a conductor 472 to an input in corresponding PUF arrays 404A, 404B, 404C, and 404D of RNG 405D in ILD 456. An output of a fourth pair of RMD 409_I in each of PUF arrays 404A, 404B, 404C, and 404D is electrically connected by a conductor 474 to an input in corresponding PUF arrays 404A, 404B, 404C, and 404D of RNG 405E in ILD 458.

In some embodiments, each of outputs 460A, 460B, 460C, and 460D from RNGs 405A, 405B, 405C, 405D, and 405E is a 16-bit random number. In some embodiments, RNG 411 is embedded in a memory array (e.g., RRAM, PCM, or the like). In some embodiments, the number of bits of a random number is adjustable as discussed above with respect to FIGS. 3A-3D. In some embodiments, RNG 411 is a 64-bit RNG including 4 ILD layers 452, 454, 456, and 458 with 16-bits per layer from outputs 460A, 460B, 460C, and 460D that are outputted in parallel. In some embodiments, the number of bits is adjustable.

In some embodiments, RNG 411 increases entropy providing an increased randomness and making a more secure PUF compared to other approaches. In some embodiments, RNG 411 is referred to as a random temporal signal generator.

Figure 4D:
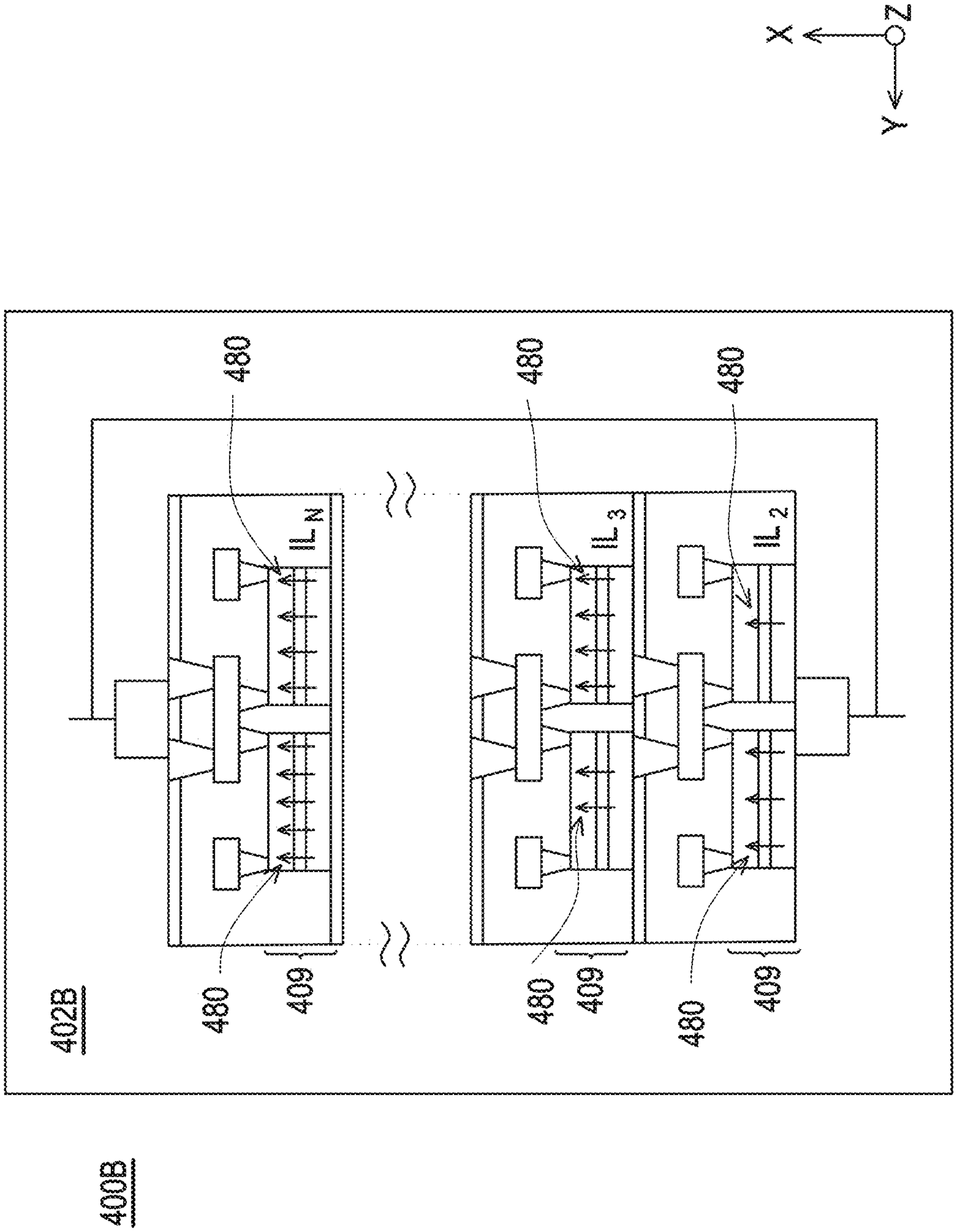
FIG. 4D is a schematic diagram of an IC, in accordance with some embodiments.

FIG. 4D is a schematic diagram of IC 400B, in accordance with some embodiments. FIG. 4D depicts a cross-sectional view of a non-limiting example of IC 400B including a number N of ILDs $IL_1$, $IL_2$, . . . . $IL_N$, each of which includes a pair of RMDs 409.

In the embodiment depicted in FIG. 4D, stochastic polarization inside ferromagnetic material of pairs of RMDs 409 produces a source of randomness for PUF applications. RMDs of the pairs of RMDs 409 include varying polarization strengths as shown by polarization arrows 480. Each pair of RMDs 409 has an unbalanced polarization such that one RMD of the two RMDs has a lower switching threshold than the other RMD of the two RMDs. In some embodiments, RMDs with a lesser or greater number of polarization arrows switches from a low resistance $R_L$ to a higher resistance $R_H$ during a randomized programming operation, for example as shown in FIG. 3C. In some embodiments, the polarization is determined during the manufacturing of the RMDs, thereby creating an unclonable PUF or PUF array in accordance with the embodiments discussed above.

Figure 5:
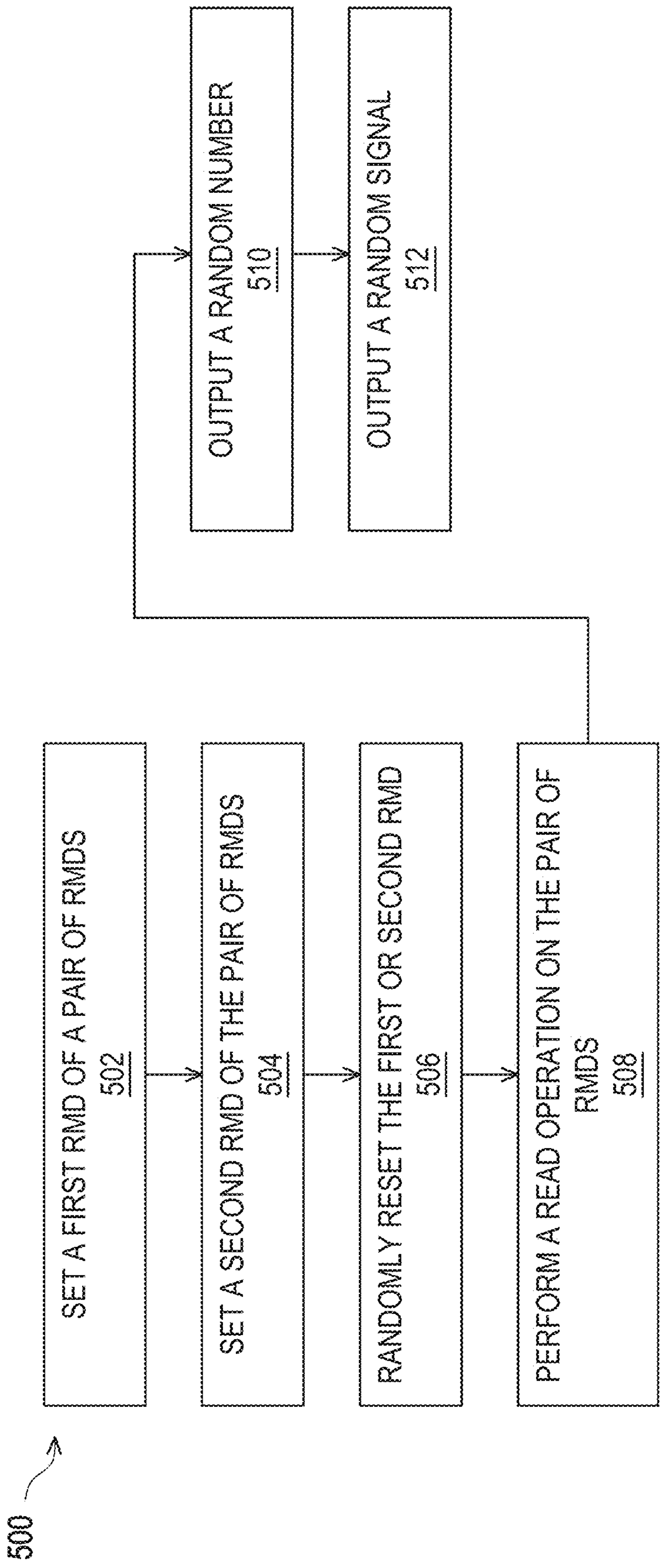
FIG. 5 is a flowchart of a method of operating a semiconductor device, in accordance with some embodiments.

FIG. 5 is a flowchart of a method 500 of operating a semiconductor device, in accordance with some embodiments. Method 500 is usable with a semiconductor device including a PUF array, e.g., one of semiconductor devices 102, 202, 302, 402, 402A, or 402B discussed above with respect to FIGS. 1-4D.

The sequence in which the operations of method 500 are depicted in FIG. 5 is for illustration only; the operations of method 500 are capable of being executed simultaneously or in sequences that differ from that depicted in FIG. 5. In some embodiments, operations in addition to those depicted in FIG. 5 are performed before, between, during, and/or after the operations depicted in FIG. 5. In some embodiments, the operations of method 500 are a subset of a method of operating a circuit including the semiconductor device. In some embodiments, some or all of the operations of method 500 correspond to a CRP.

At operation 502, a first RMD of a pair of RMDs is set in a first programming operation. Setting the first RMD includes applying a first voltage to serially connected inverters and a second voltage to a common node of the pair of RMDs in parallel with an inverter of the serially connected inverters.

In some embodiments, applying the first and second voltages includes applying the same voltage as the first and second voltages. In some embodiments, applying the first voltage to the serially connected inverters and the second voltage to the common node of the pair of RMDs includes applying voltage VPP at write line 316A and nodes 310 as discussed above with respect to FIG. 3A.

In some embodiments, setting the first RMD in the first programming operation includes setting the first RMD to low resistance $R_L$ discussed above with respect to FIGS. 2A-4D.

In some embodiments, setting the first RMD of the pair of RMDs includes setting an RMD of pair of RMDs 209, 309A-309D, or 409 discussed above with respect to FIGS. 2A-4D.

In some embodiments, the pair of RMDs is one pair of RMDs of a plurality of pairs of RMDs, and setting the first RMD of the pair of RMDs includes setting first RMDs of each pair of RMDs of the plurality of pairs of RMDs, e.g., pairs of RMDs 309A-309D discussed above with respect to FIGS. 3A-3D or pairs of RMDs 409 discussed above with respect to FIGS. 4A-4D.

At operation 504, a second RMD of the pair of RMDs is set in a second programming operation. Setting the second RMD includes applying a third voltage to the serially connected inverters and the second voltage to the common node of the pair of RMDs. In some embodiments, applying the third voltage to the serially connected inverters and the second voltage to the common node of the pair of RMDs includes applying the ground or 0V voltage at write line 316A and voltage VPP at nodes 310 as discussed above with respect to FIG. 3A.

In some embodiments, setting the second RMD in the second programming operation includes setting the second RMD to low resistance $R_L$ discussed above with respect to FIGS. 2A-4D.

In some embodiments, setting the second RMD of the pair of RMDs includes setting an RMD of pair of RMDs 209, 309A-309D, or 409 discussed above with respect to FIGS. 2A-4D.

In some embodiments, the pair of RMDs is one pair of RMDs of a plurality of pairs of RMDs, and setting the second RMD of the pair of RMDs includes setting second RMDs of each pair of RMDs of the plurality of pairs of RMDs, e.g., pairs of RMDs 309A-309D discussed above with respect to FIGS. 3A-3D or pairs of RMDs 409 discussed above with respect to FIGS. 4A-4D.

In some embodiments, one or both of operations 502 or 504 further includes programming both RMDs of another pair of RMDs to opposite settings, e.g., as discussed above with respect to pair of RMDs 209 and FIGS. 2A-2C.

At operation 506, the first or second RMD of the pair of RMDs is randomly reset in a third programming operation. Randomly resetting the first or second RMD includes applying a fourth voltage to the serially connected inverters and floating the common node of the pair of RMDs. In some embodiments, applying the fourth voltage to the serially connected inverters and floating the common node of the pair of RMDs includes applying erase voltage VEE at write line 316A and floating nodes 310 as discussed above with respect to FIG. 3A.

In some embodiments, randomly resetting the first or second RMD in the third programming operation includes resetting the first or second RMD to high resistance $R_H$ discussed above with respect to FIGS. 2A-4D.

In some embodiments, randomly resetting the first or second RMD includes resetting an RMD of pair of RMDs 209, 309A-309D, or 409 discussed above with respect to FIGS. 2A-4D.

In some embodiments, the pair of RMDs is one pair of RMDs of a plurality of pairs of RMDs, and randomly resetting the first or second RMD includes resetting first or second RMDs of each pair of RMDs of the plurality of pairs of RMDs, e.g., pairs of RMDs 309A-309D discussed above with respect to FIGS. 3A-3D or pairs of RMDs 409 discussed above with respect to FIGS. 4A-4D.

At operation 508, a read operation is performed on the pair of RMDs. Performing the read operation includes applying a fifth voltage to the serially connected inverters and measuring a voltage at the common node of the pair of RMDs. In some embodiments, applying the fifth voltage to the serially connected inverters and measuring the voltage at the common node of the pair of RMDs includes applying voltage Vin at input 216A and measuring the voltage at node 210E as discussed above with respect to FIGS. 2A-2C or applying voltage Vin at write line 316A and measuring voltage VY at one of nodes 310 as discussed above with respect to FIG. 3A.

In some embodiments, measuring the voltage at the common node of the pair of RMDs includes measuring the voltage at node 210E of pair of RMDs 209, node 310 of pair of RMDs 309A-309D, or the common node of pair of RMDs 409 discussed above with respect to FIGS. 2A-4D.

In some embodiments, the pair of RMDs is one pair of RMDs of a plurality of pairs of RMDs, and measuring the voltage at the common node of the pair of RMDs includes measuring the voltage at the common node of each pair of RMDs of the plurality of pairs of RMDs, e.g., pairs of RMDs 309A-309D discussed above with respect to FIGS. 3A-3D or pairs of RMDs 409 discussed above with respect to FIGS. 4A-4D.

At operation 510, in some embodiments, a random number is output. Outputting the random number includes outputting the random number based on the read operation. In some embodiments, outputting the random number includes outputting the random number from a PUF array. In some embodiments, outputting the random number from the PUF array includes outputting the random number from PUF 304 discussed above with respect to FIGS. 3A-3D or RNG 405, 407, and/or 411 discussed above with respect to FIGS. 4A-4D.

At operation 512, in some embodiments, a random signal is output. Outputting the random signal includes outputting the random signal based on sequentially performing the read operation. In some embodiments, outputting the random signal includes outputting the random signal from a PUF array. In some embodiments, outputting the random signal from the PUF array includes outputting the random signal from PUF 304 discussed above with respect to FIGS. 3A-3D or RNG 405, 407, and/or 411 discussed above with respect to FIGS. 4A-4D.

By executing some or all of the operations of method 500, a RMD of a pair of RMDs is randomly programmed and read, thereby realizing the benefits discussed above with respect to ICs 100-400.

Figure 6:
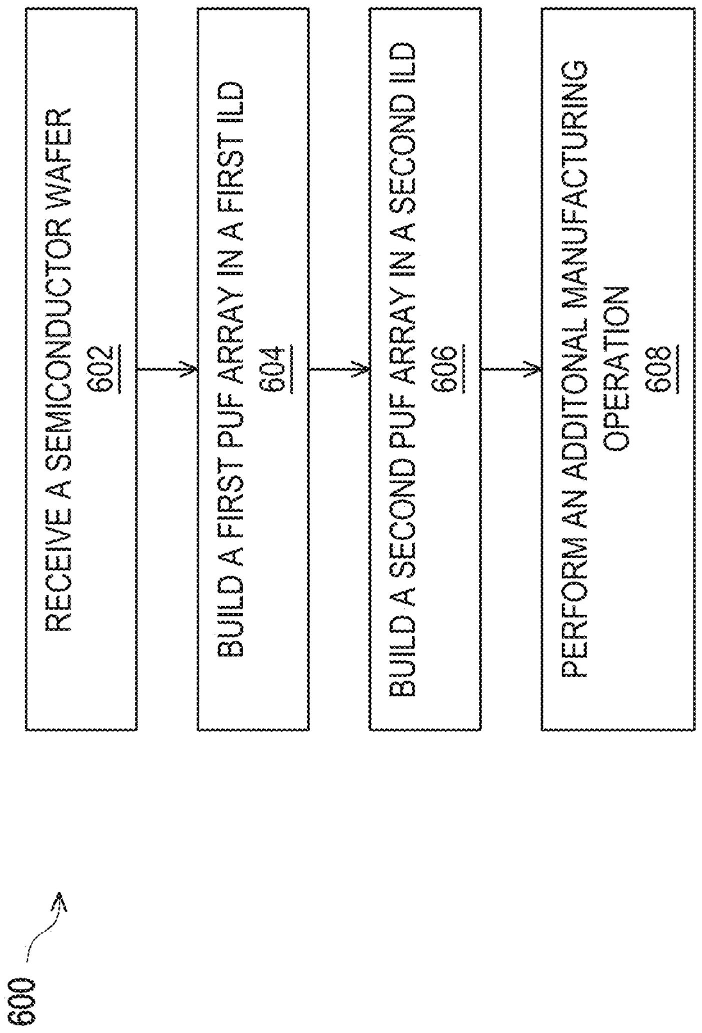
FIG. 6 is a flowchart of a method of manufacturing a semiconductor device, in accordance with some embodiments.

FIG. 6 is a flowchart of a method 600 of manufacturing a semiconductor device, in accordance with some embodiments. Method 600 is operable to form a semiconductor device including a PUF array, e.g., one of semiconductor devices 102, 202, 302, 402, 402A, or 402B discussed above with respect to FIGS. 1-4D. In some embodiments, operations of method 600 are a subset of operations of a method of forming a semiconductor wafer or die.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, between, and/or after the operations of method 600.

At operation 602, in some embodiments, a partially processed semiconductor wafer is received. Receiving the partially processed semiconductor wafer includes receiving a substrate including silicon and/or one or more other suitable semiconductor materials.

At operation 604, a first PUF array is built in a first ILD. Building the first PUF array includes building the first PUF array in the first ILD being an ILD, e.g., a first or higher ILD, of the partially processed semiconductor wafer.

Building the first PUF array in the first ILD of the partially processed semiconductor wafer includes building a first plurality of inverters and a first plurality of pairs of RMDs, e.g., inverters 208, 308A-308E, or 408 and pairs of RMDs 209, 309A-309D, or 409 configured to operate as discussed above with respect to FIGS. 1-4D.

In some embodiments, building the first PUF array in the first ILD includes building the first PUF array in ILD IL1 discussed above with respect to FIGS. 4A-4D.

Building the first PUF array includes performing a first plurality of manufacturing operations, e.g., one or more of a lithography, diffusion, deposition, etching, planarizing, or other operation suitable for building the first plurality of inverters and first plurality of pairs of RMDs in the first ILD.

At operation 606, in some embodiments, a second PUF array is built in a second ILD overlying the first ILD. Building the second PUF array in the second ILD of the partially processed semiconductor wafer includes building a second plurality of inverters and a second plurality of pairs of RMDs, e.g., inverters 208, 308A-308E, or 408 and pairs of RMDs 209, 309A-309D, or 409 configured to operate as discussed above with respect to FIGS. 1-4D.

In some embodiments, building the second PUF array in the second ILD includes building the second PUF array in ILD IL2 discussed above with respect to FIGS. 4A-4D. In some embodiments, building the second PUF array in the second ILD includes building one or more additional PUF arrays in one or more ILDs overlying the second ILD, e.g., ILDs IL3-IL5 discussed above with respect to FIGS. 4A-4D.

Building the second PUF array includes performing a second plurality of manufacturing operations, e.g., one or more of a lithography, diffusion, deposition, etching, planarizing, or other operation suitable for building the second plurality of inverters and second plurality of pairs of RMDs in the second ILD.

At operation 608, in some embodiments, one or more additional manufacturing operations are performed. In some embodiments, performing the one or more additional manufacturing operations includes performing one or more IC packaging operations, e.g., a bonding, encapsulation, or injection operation. In some embodiments, performing the one or more additional manufacturing operations includes performing one or more semiconductor wafer processing operations, e.g., a deposition, etch, or planarization operation.

By performing some or all of the operations of method 600, a semiconductor device is manufactured including a PUF array positioned in a first ILD, thereby realizing the benefits discussed above with respect to ICs 100-400.

In some embodiments, a semiconductor device includes an array of M inverters, M being an integer of at least 2 such that the array of M inverters includes at least a first inverter and a second inverter; (M−1) pairs of resistive memory devices (RMDs) coupled to the array of M inverters; and a write line coupled to an input of the first inverter, (M−1) inverters of the array of M inverters each being connected in parallel with a pair of RMDs of the (M−1) pairs of RMDs. In some embodiments, the second inverter has an input coupled to an output of the first inverter, a first pair of RMDs of the (M−1) pairs of RMDs is coupled in parallel with the second inverter, the first pair of RMDs includes a first RMD and a second RMD, the first RMD is coupled between the input of the second inverter and an output node, and the second RMD is coupled between an output of the second inverter and the output node. In some embodiments, the (M−1) pairs of RMDs are controllable whereby the array of M inverters and the (M−1) pairs of RMDs are configured to be controllably programmed as each of a NOT gate and a YES gate. In some embodiments, the (M−1) pairs of RMDs have commonly-coupled output nodes. In some embodiments, the commonly-coupled output nodes are configured to carry an output signal of each of the NOT gate and the YES gate. In some embodiments, the array of M inverters and the (M−1) pairs of RMDs are configured to perform a physically unclonable function, and, in a randomized programming operation of a first pair of RMDs of the (M−1) pairs of RMDs, the semiconductor device is configured to apply a first voltage to the write line while floating a common output node of the first pair of RMDs. In some embodiments, in a read operation of the first pair of RMDs, the semiconductor device is configured to apply a second voltage to the write line and output a measurement voltage from the common output node.

In some embodiments, a semiconductor device includes M inverters, M being a positive integer, the M inverters being electrically connected serially, and (M−1) pairs of RMDs, wherein a first inverter of the M inverters is electrically connected to a first node, the first node being electrically connected to a first RMD of a first pair of RMDs of the (M−1) pairs of RMDs and to a second inverter of the M inverters, and each inverter after the first inverter of the M inverters is electrically connected in parallel with a pair of RMDs of the (M−1) pairs of RMDs. In some embodiments, the semiconductor device includes a write line configured to program one or more RMDs of the (M−1) pairs of RMDs, the write line being electrically connected to an input of the first inverter of the M inverters. In some embodiments, the semiconductor device includes a plurality of output nodes, wherein each output node electrically connects the RMDs of a corresponding pair of the (M−1) pairs of RMDs to one another. In some embodiments, a first RMD of a corresponding pair of RMDs is electrically connected to a first inverter output, a second inverter input, and a first output node of the plurality of output nodes. In some embodiments, a second RMD of the corresponding pair of RMDs is electrically connected to a second inverter output, a third inverter input, and the first output node of the plurality of output nodes. In some embodiments, the semiconductor device includes a first level of the semiconductor device including the M inverters being first M inverters of a plurality of M inverters and the (M−1) pairs of RMDs being first (M−1) pairs of RMDs of a plurality of (M−1) pairs of RMDs, and a second level of the semiconductor device above the first level of the semiconductor device, the second level of the semiconductor device including second M inverters of the plurality of M inverters, the second M inverters being electrically connected serially, and second (M−1) pairs of RMDs of the plurality of (M−1) pairs of RMDs, the second (M−1) pairs of RMDs being electrically connected in parallel with the second M inverters except for a first inverter of the second M inverters, wherein an input of the first inverter of the second M inverters is electrically connected to an output node of a corresponding pair of RMDs of the first (M−1) pairs of RMDs. In some embodiments, the M inverters are first M inverters of a plurality of M inverters, the (M−1) pairs of RMDs are first (M−1) pairs of RMDs of a plurality of (M−1) pairs of RMDs, and the semiconductor device includes second M inverters of the plurality of M inverters, the second M inverters being parallel to the first M inverters, and second (M−1) pairs of RMDs of the plurality of (M−1) pairs of RMDs, the second (M−1) pairs of RMDs being electrically connected in parallel with the second M inverters except for a first inverter of the second M inverters, wherein an input of the first inverter of the second M inverters is electrically connected to an output node of a pair of RMDs of the first (M−1) pairs of RMDs.

In some embodiments, a method of operating a semiconductor device includes setting a first RMD of a pair of RMDs in a first programming operation, setting a second RMD of the pair of RMDs in a second programming operation, randomly resetting one of the first or second RMDs in a third programming operation, and performing a read operation on the pair of RMDs. In some embodiments, setting the first RMD in the first programming operation includes applying a first voltage to serially connected inverters and to a common node of the pair of RMDs arranged in parallel with an inverter of the serially connected inverters, and setting the second RMD in the second programming operation includes applying a second voltage to the serially connected inverters and the first voltage to the common node of the pair of RMDs. In some embodiments, randomly resetting the first or second RMD includes applying a third voltage to the serially connected inverters and floating the common node of the pair of RMDs. In some embodiments, performing the read operation on the pair of RMDs includes applying a fourth voltage to the serially connected inverters and measuring a voltage at the common node of the pair of RMDs. In some embodiments, the method includes outputting a random number based on the read operation. In some embodiments, the method includes outputting a random signal based on sequentially performing the read operation.

It is readily seen by one of ordinary skill in the art that one or more of the disclosed embodiments fulfill one or more of the advantages set forth above. After reading the foregoing specification, one of ordinary skill is able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
- an array of M inverters, M being an integer of at least 2 such that the array of M inverters includes at least a first inverter and a second inverter;
- (M−1) distinct pairs of resistive memory devices (RMDs) coupled to the array of M inverters; and
- a write line coupled to an input of the first inverter, wherein:
  - (M−1) inverters of the array of M inverters are each connected in parallel with a distinct pair of RMDs of the (M−1) distinct pairs of RMDs.

2. The semiconductor device of claim 1, wherein:
- the second inverter has an input coupled to an output of the first inverter,
- a first distinct pair of RMDs of the (M−1) distinct pairs of RMDs is coupled in parallel with the second inverter,
- the first distinct pair of RMDs includes a first RMD and a second RMD,
- the first RMD is coupled between the input of the second inverter and an output node, and
- the second RMD is coupled between an output of the second inverter and the output node.

3. The semiconductor device of claim 1, wherein:
- the (M−1) distinct pairs of RMDs are controllable whereby the array of M inverters and the (M−1) distinct pairs of RMDs are configured to be controllably programmed as each of a NOT gate and a YES gate.

4. The semiconductor device of claim 3, wherein:
- each distinct pair of RMDs of the (M−1) distinct pairs of RMDs share a commonly-coupled output node.

5. The semiconductor device of claim 4, wherein:
- the commonly-coupled output node of each distinct pair of RMDs is configured to carry an output signal of each of the NOT gate and the YES gate.

6. The semiconductor device of claim 1, wherein:
- the array of M inverters and the (M−1) distinct pairs of RMDs are configured to perform a physically unclonable function, and
- in a randomized programming operation of a first distinct pair of RMDs of the (M−1) distinct pairs of RMDs, the semiconductor device is configured to apply a first voltage to the write line while floating a common output node of the first distinct pair of RMDs.

7. The semiconductor device of claim 6, wherein:
- in a read operation of the first distinct pair of RMDs, the semiconductor device is configured to apply a second voltage to the write line and output a measurement voltage from the common output node.

8. A semiconductor device, comprising:
- M inverters, M being a positive integer, the M inverters being electrically connected serially; and
- (M−1) pairs of resistive memory devices (RMDs), wherein:
  - a first inverter of the M inverters is electrically connected to a first node, the first node being electrically connected to a first RMD of a first pair of RMDs of the (M−1) pairs of RMDs and to a second inverter of the M inverters, and
  - each inverter after the first inverter of the M inverters is electrically connected in parallel with a distinct pair of RMDs of the (M−1) pairs of RMDs.

9. The semiconductor device of claim 8, further comprising:
- a write line configured to program one or more RMDs of the (M−1) pairs of RMDs, the write line being electrically connected to an input of the first inverter of the M inverters.

10. The semiconductor device of claim 8, further comprising:
- a plurality of output nodes, wherein each output node electrically connects the RMDs of a corresponding distinct pair of the (M−1) pairs of RMDs to one another.

11. The semiconductor device of claim 10, wherein:
- a first RMD of a corresponding pair of RMDs is electrically connected to a first inverter output, a second inverter input, and a first output node of the plurality of output nodes.

12. The semiconductor device of claim 11, wherein:
- a second RMD of the corresponding pair of RMDs is electrically connected to a second inverter output, a third inverter input, and the first output node of the plurality of output nodes.

13. The semiconductor device of claim 8, further comprising:
- a first level of the semiconductor device including the M inverters being first M inverters of a plurality of M inverters and the (M−1) pairs of RMDs being first (M−1) pairs of RMDs of a plurality of (M−1) pairs of RMDs; and
- a second level of the semiconductor device above the first level of the semiconductor device, the second level of the semiconductor device including:
  - second M inverters of the plurality of M inverters, the second M inverters being electrically connected serially; and
  - second (M−1) pairs of RMDs of the plurality of (M−1) pairs of RMDs, the second (M−1) pairs of RMDs being electrically connected in parallel with the second M inverters except for a first inverter of the second M inverters,
- wherein an input of the first inverter of the second M inverters is electrically connected to an output node of a corresponding pair of RMDs of the first (M−1) pairs of RMDs.

14. The semiconductor device of claim 8, wherein:

the M inverters are first M inverters of a plurality of M inverters, the (M−1) pairs of RMDs are first (M−1) pairs of RMDs of a plurality of (M−1) pairs of RMDs, and the semiconductor device further comprises:

second M inverters of the plurality of M inverters, the second M inverters being parallel to the first M inverters; and second (M−1) pairs of RMDs of the plurality of (M−1) pairs of RMDs, the second (M−1) pairs of RMDs being electrically connected in parallel with the second M inverters except for a first inverter of the second M inverters, wherein an input of the first inverter of the second M inverters is electrically connected to an output node of a pair of RMDs of the first (M−1) pairs of RMDs.

15. A method of operating a semiconductor device, the method comprising:

setting a first resistive memory device (RMD) of a pair of RMDs in a first programming operation;

setting a second RMD of the pair of RMDs in a second programming operation;

randomly resetting one of the first or second RMDs in a third programming operation; and performing a read operation on the pair of RMDs.

16. The method of claim 15, wherein the setting the first RMD in the first programming operation includes applying a first voltage to serially connected inverters and to a common node of the pair of RMDs arranged in parallel with an inverter of the serially connected inverters, and the setting the second RMD in the second programming operation includes applying a second voltage to the serially connected inverters and the first voltage to the common node of the pair of RMDs.

17. The method of claim 16, wherein:

the randomly resetting the first or second RMD includes applying a third voltage to the serially connected inverters and floating the common node of the pair of RMDs.

18. The method of claim 17, wherein:

the performing the read operation on the pair of RMDs includes applying a fourth voltage to the serially connected inverters and measuring a voltage at the common node of the pair of RMDs.

19. The method of claim 15, further comprising:

outputting a random number based on the read operation.

20. The method of claim 15, further comprising:

outputting a random signal based on sequentially performing the read operation.

* * * * *